US007522004B2

(12) United States Patent  
Saito

(10) Patent No.: US 7,522,004 B2  
(45) Date of Patent: Apr. 21, 2009

(54) HIGH-FREQUENCY ELECTRONIC SWITCH, AND BURST WAVE GENERATING DEVICE USING THE SAME AND SHORT RANGE RADAR USING THE SAME

(75) Inventor: Sumio Saito, Atsugi (JP)

(73) Assignee: Anritsu Corporation, Tokyo (JP)

( * ) Notice: Subject to any disclaimer, the term of this patent is extended or adjusted under 35 U.S.C. 154(b) by 134 days.

(21) Appl. No.: 10/588,910

(22) PCT Filed: Nov. 14, 2005

(86) PCT No.: PCT/JP2005/020860

§ 371 (c)(1),
(2), (4) Date: Aug. 9, 2006

(87) PCT Pub. No.: WO2006/051948

PCT Pub. Date: May 18, 2006

(65) Prior Publication Data

US 2007/0139254 A1   Jun. 21, 2007

(30) Foreign Application Priority Data

Nov. 15, 2004   (JP)   ............................. 2004-331029

(51) Int. Cl.
*H03F 3/04* (2006.01)
(52) U.S. Cl. ........................................ 330/310; 330/98
(58) Field of Classification Search .................. 330/98, 330/10, 150, 261, 310
See application file for complete search history.

(56) References Cited

U.S. PATENT DOCUMENTS 4,794,342 A * 12/1988 Kimura .......................... 330/2

(Continued)

FOREIGN PATENT DOCUMENTS

JP            54-5315          1/1979

(Continued)

OTHER PUBLICATIONS

Notification Concerning Transmittal of International Preliminary Report on Patentability, Chapter I of the Patent Cooperation Treaty, and Written Opinion of the International Searching Authority, for PCT/JP2005/020860, Dated May 24, 2007. 6 sheets.

(Continued)

*Primary Examiner*—Henry K Choe
(74) *Attorney, Agent, or Firm*—Frishauf, Holtz, Goodman & Chick, P.C.

(57) ABSTRACT

A high-frequency electronic switch includes a signal input terminal to which a high-frequency signal to be switched is input, a plurality of amplifying circuits with transistors, to respectively amplify the high-frequency signal to be switched sequentially, the amplifying circuits being cascade-connected in a plurality of stages to the signal input terminal, a signal output terminal which is connected to an output section of an amplifying circuit at final stage among the plurality of amplifying circuits, and which outputs the high-frequency signal to be switched sequentially amplified, a control terminal to which a pulse signal serving as a switching signal having a period of a first level and a period of a second level is input, and a supply current control circuit which makes the plurality of amplifying circuits be in an amplification-operational state by supplying operational current to each of the transistors of the plurality of amplifying circuits in a period when the pulse signal input to the control terminal is at the first level, and which makes the plurality of amplifying circuits be in a non-amplification-operational state by stopping supplying operational current to each of the transistors of the plurality of amplifying circuits in a period when the pulse signal is at the second level. The high-frequency electronic switch effectively suppresses leakage of high-frequency signal at the time of off-state by turning on/off between the signal input terminal and the signal output terminal so as to be able to be isolated substantially high-frequency likewise in accordance with a level of the pulse signal input to the control terminal.

14 Claims, 8 Drawing Sheets

U.S. PATENT DOCUMENTS

| | | | |
|---|---|---|---|
| 5,802,464 A | * | 9/1998 | Ashida .................... 455/339 |
| 5,838,197 A | * | 11/1998 | Tsukuda .................. 330/252 |
| 5,920,209 A | * | 7/1999 | Kusumoto et al. ............ 327/91 |
| 2006/0203936 A1 | | 9/2006 | Roovers et al. |

FOREIGN PATENT DOCUMENTS

| | | |
|---|---|---|
| JP | 60-41805 A | 3/1985 |
| JP | 60-62711 A | 4/1985 |
| JP | 64-48506 A | 2/1989 |
| JP | 1-280908 A | 11/1989 |
| JP | 2-244903 A | 9/1990 |
| JP | 5-188137 A | 7/1993 |
| JP | 7-12921 A | 1/1995 |
| JP | 8-313619 A | 11/1996 |
| JP | 2000-244293 A | 9/2000 |
| WO | 2004/091161 A1 | 10/2004 |

OTHER PUBLICATIONS

FCC 02-48 New Part 15 Rules, First Report and Order; Apr. 2002.

FCC 04-285 Second Report and Order and Second Memorandum Opinion and Order; Dec. 16, 2004.

O'Donnel I et al, "An Integrated, low power, ultra-wideband transceiver architecture for low-rate, indoor wireless systems", IEEE Wireless Communications and Networking Conference, Sep. 4, 2002, pp. 1-8 XP002269840.

Extended European Search Report dated Aug. 6, 2008, issued in a counterpart European Application.

* cited by examiner

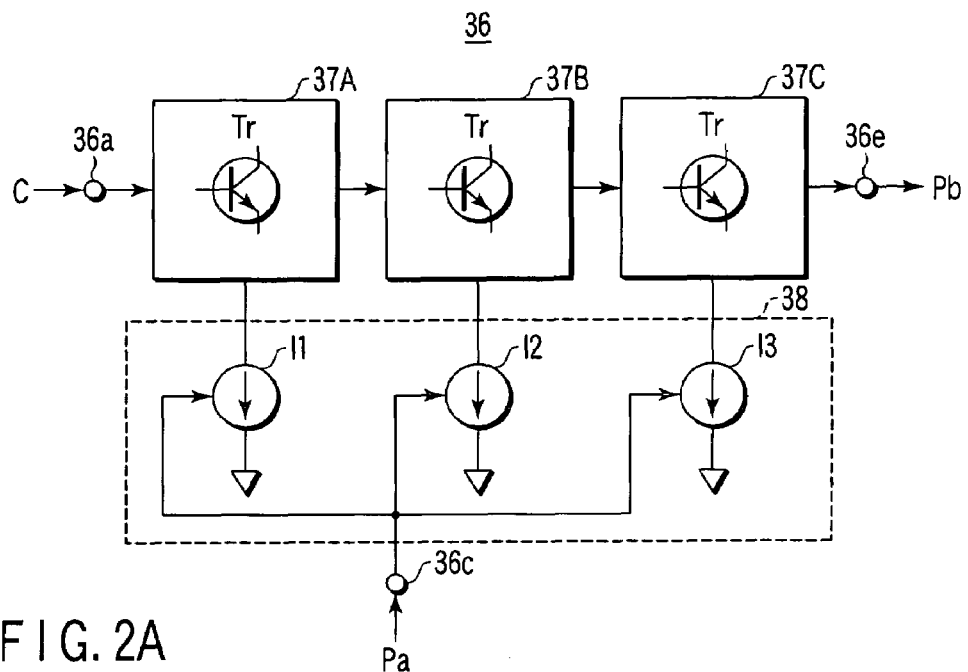
F I G. 2A
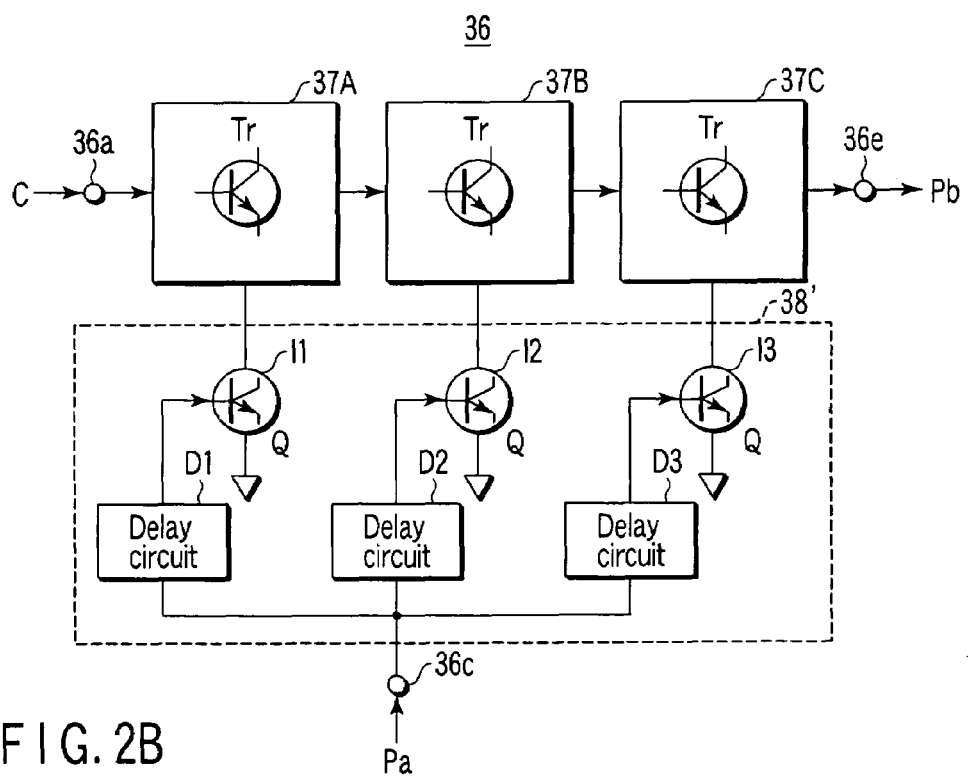
F I G. 2B

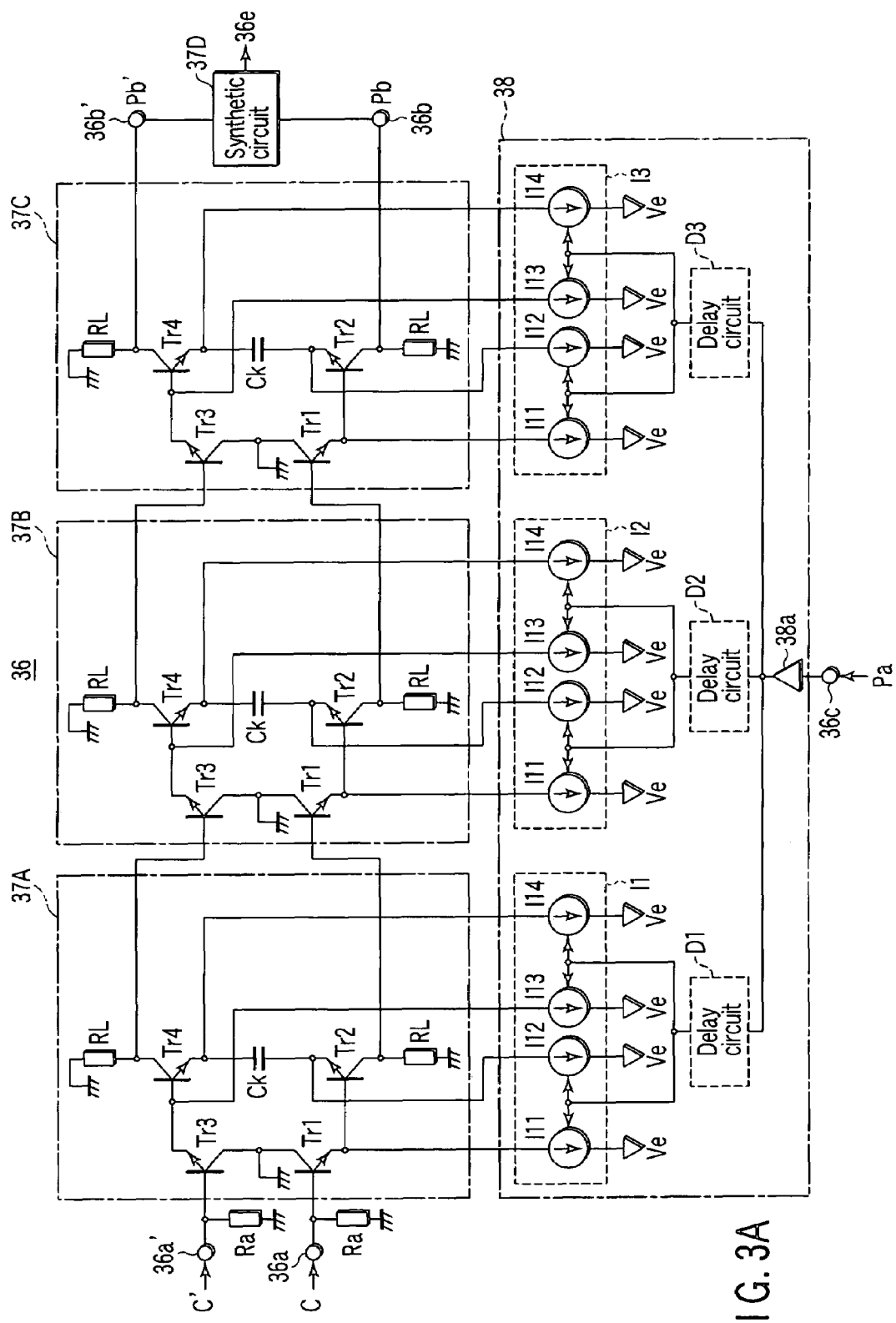
F I G. 3A

US 7,522,004 B2

HIGH-FREQUENCY ELECTRONIC SWITCH, AND BURST WAVE GENERATING DEVICE USING THE SAME AND SHORT RANGE RADAR USING THE SAME

This application is a U.S. National Phase Application under 35 USC 371 of International Application PCT/JP2005/020860 filed Nov. 14, 2005.

TECHNICAL FIELD

The present invention relates to a high-frequency electronic switch, a burst wave generating device using the same, and a short range radar using the same. In particular, the invention relates to a high-frequency electronic switch which employs a technology for preventing leakage of carrier thereof in a burst wave generating device for use in a transmitting unit such as short range radars at a quasi-millimeter waveband (UWB: Ultra-wideband) of 22 to 29 GHz which is assigned for automotive radars, radars for walking support for visually impaired humans, and the like, a burst wave generating device using the same, and a short range radar using the same.

BACKGROUND ART

A pulse radar which searches for an object in a space by using a pulse wave basically has the configuration shown in FIG. 6.

Namely, a transmitting unit 11 receives a trigger signal G output at a predetermined cycle Tg from a control unit 20 which will be described later, by a pulse generator 12.

The pulse generator 12 outputs a pulse signal Pa with a predetermined width synchronous with a trigger signal G to a burst wave generating device 13.

The burst wave generating device 13 outputs a burst wave Pb having a carrier signal with a predetermined frequency in a period when a pulse signal Pa is being input (for example, in a period when a pulse signal Pa is being at a high level). In addition, the burst wave generating device 13 stops outputting a burst wave Pb having the carrier signal in a period when a pulse signal Pa is not input (for example, in a period when a pulse signal Pa is at a low level).

Note that examples of the configuration of the burst wave generating device 13 include a system in which a burst wave having a carrier signal with a predetermined frequency which is continuously output is made intermittent by a switch, and a system in which an oscillation operation of an oscillator oscillating a burst wave having a carrier signal with a predetermined frequency to output is controlled to be on/off.

A burst wave Pb output from the burst wave generating device 13 is amplified by a power amplifier 14, and is supplied to a transmitting antenna 15.

Therefore, a pulse wave Pt with a predetermined width which is synchronous with a trigger signal G is emitted into a space 1.

When the pulse wave Pt is reflected by the body 1a existing in the space 1, the reflected wave Pr is received by a receiving antenna 17 of the receiving unit 16, and a received signal R thereof is detected by a wave-detecting circuit 18.

A signal processing unit 19 analyzes the body 1a existing in the space 1 by determining a timing of a change in a level of a signal H output from the receiving unit 16, or an output waveform in, for example, a timing when a pulse wave Pa is transmitted from the pulse generator 12 of the transmitting unit 11 being as a reference timing.

The control unit 20 performs predetermined various controls onto the transmitting unit 16 and the receiving unit 11 based on processing results of the signal processing unit 19.

Note that a basic configuration of such a radar is disclosed in the following Patent Documents 1 and 2.

Pat. Document 1: Jpn. Pat. Appln. Kokai Publication No. 7-012921

Pat. Document 2: Jpn. Pat. Appln. Kokai Publication No. 8-313619

Radars for automobile use to be put into practical use in recent years among radars having such a basic configuration include two types of the following radars.

Pulse radars of the first type are radars aiming at support at the time of high-speed driving, such as collision prevention and driving control by searching for a narrow angular range at long range on high power using a millimeter waveband (77 GHz).

Pulse radars of the second type are short range radars aiming at support at the time of low-speed driving, such as dead zone assistance for automobile and assistance for putting a car in a garage by searching for a wide angular range at close range on low power using a quasi-millimeter waveband (22 to 29 GHz).

UWB radars using the quasi-millimeter waveband are used as, not only radars for automobile use, but also radars for walking support for visually impaired humans, close range communication system, and the like.

In broadband UWB radars, for example, a short pulse whose width is 1 ns or less can be used, which can realize a radar with a high range resolving power.

DISCLOSURE OF INVENTION

However, in order to realize this UWB radar, there are various sorts of problems to be solved.

One of the important problems is a problem of leakage of a carrier signal of a burst wave output from the transmitting unit 11.

By the way, as described above, a waveband of 22 to 29 GHz is to be used in a UWB radar. However, a RR radiowave emission prohibited band (23.6 to 24.0 GHz) for protecting passive sensors of radio astronomy or earth exploration satellite service (EESS) is included in this band.

In 2002, the Federal Communications Commission (FCC) of USA has disclosed the rule that an average power density is to −41.3 dBm or less, and a peak power density is 0 dBm/50 MH at 22 to 29 GHz in the following Non-Patent Document 1.

In this rule, it is stipulated that a wave angle side lobe is reduced to be −25 dB to −35 dB every several years in order to suppress radio interference onto the aforementioned EESS as well.

Non-Patent Document 1: FCC 02-48 New Part 15 Rules, FIRST REPORT AND ORDER

However, in order to achieve this, it is assumed that a dimension in a vertical direction of an antenna used for a UWB radar is made larger, and that it is difficult to mount the antenna onto a general passenger vehicle.

For this reason, as a method which does not depend on a side lobe of an antenna, the FCC has added the revised rule that a radiation power density at the RR radiowave emission prohibited band is −61.3 dBm/MHz which is less by 20 dB than the previous one in the following Non-Patent Document 2 in 2004.

Non-Patent Document 2: "Second Report and Order and Second Memorandum Opinion and Order" FCC 04-285, Dec. 16, 2004

Conventional UWB radars employ a system in which a continuous wave (CW) from a continuous oscillator is turned on/off by a semiconductor switch.

Because, in this system, a large residual carrier is generated due to the incompleteness in isolation of the switch as shown by the broken line in FIG. 7, the residual carrier is evacuated into an short range device (SRD) band of 24.05 to 24.25 GHz which is assigned for a Doppler radar.

However, there is the serious problem that the SRD band is extremely close to the RR radiowave emission prohibited band, which brings about unavoidable interference with an EESS or the like.

Accordingly, as a radar system utilizing a frequency in the vicinity of the RR radiowave emission prohibited band as a carrier frequency, it is necessary to narrow down a beam in a horizontal direction. Consequently, a dimension in a vertical direction of the transmitting antenna is made large of necessity, and it is extremely disadvantageous at the thought of automobile use or mobile use.

Note that, as described above, in a case of the system in which a burst wave having a carrier signal with a predetermined frequency which is continuously output is made intermittent by a switch, it is necessary to use a high-frequency electron switch by a semiconductor device in a UWB radar system in order to response to a pulse with a narrow width which is, for example, 1 ns or less.

However, because leakage of carrier signal in the off state is great in a high-frequency electric on switch (for example, a diode switch or an analog switch) by a conventional semiconductor device, the problem that a searching range or the like as the radar system is greatly limited becomes prominent.

Further, in a case of a diode switch, configuration is made in many cases so as to be in on state by making electric current flow in a diode via a coil, and it is impossible to favorably response to a pulse with a narrow width such as, for example, a short pulse with a width less than or equal to 1 ns.

In consideration of these circumstances, it has been strongly desired to realize a high-frequency electronic switch in which a speed of response is high even at a frequency band or the like shown by the solid line in FIG. 7, and leakage is little, and to realize a burst wave generating device using the same and a short range radar using the same.

An object of the present invention is to provide a high-frequency electronic switch in which a speed of response is high even at a frequency band or the like of UWB higher than the RR radiowave emission prohibited band, and leakage is little, and to provide a burst wave generating device using the same and a short range radar using the same.

In order to achieve the above object, according to a first aspect of the present invention, there is provided a high-frequency electronic switch comprising:

a signal input terminal (36a) to which a high-frequency signal (C) to be switched is input;

a plurality of amplifying circuits (37A, 37B, 37C) with transistors (Tr) to respectively amplify the high-frequency signal (C) to be switched sequentially, the amplifying circuits being cascade-connected in a plurality of stages to the signal input terminal (36a);

a signal output terminal (36e) which is connected to an output section of an amplifying circuit (37C) at final stage among the plurality of amplifying circuits (37A, 37B, 37C), and which outputs the high-frequency signal (C) to be switched sequentially amplified;

a control terminal (36c) to which a pulse signal (Pa) serving as a switching signal and having a period of a first level and a period of a second level is input; and a supply current control circuit (38) which makes the plurality of amplifying circuits (37A, 37B, 37C) be in an amplification-operational state by supplying operational current to each of the transistors (Tr) of the plurality of amplifying circuits (37A, 37B, 37C) in a period when the pulse signal (Pa) input to the control terminal (36c) is at the first level, and which makes the plurality of amplifying circuits (37A, 37B, 37C) be in a non-amplification-operational state by stopping supplying operational current to each of the transistors (Tr) of the plurality of amplifying circuits (37A, 37B, 37C) in a period when the pulse signal (Pa) is at the second level, the high-frequency electronic switch which turns on/off between the signal input terminal (36a) and the signal output terminal (36e) substantially high-frequency likewise in accordance with a level of the pulse signal input to the control terminal.

Also, in order to achieve above object, according to a second aspect of the present invention, there is provided a high-frequency electronic switch according to the first aspect of the invention, comprising:

a positive-phase signal input terminal (36b) and a negative-phase signal input terminal (36b') which are provided as the signal input terminal (36a), and to which at least one of positive-phase and negative-phase high-frequency signals (C, C') is input as the high-frequency signal (C) to be switched; and a positive-phase signal output terminal (36a) and a negative-phase signal output terminal (36a') which are provided as the signal output terminal (36e), and from which at least one of the positive-phase and negative-phase high-frequency signals (C, C') is output, wherein the plurality of amplifying circuits (37A, 37B, 37C) which are cascade-connected in a plurality of stages between the positive-phase signal input terminal (36a) and the negative-phase signal input terminal (36a'), and between the positive-phase signal output terminal (36b) and the negative-phase signal output terminal (36b'), are respectively configured to be a differential type with a plurality of transistors (Tr1, Tr2, Tr3, Tr4).

Also, in order to achieve above object, according to a third aspect of the present invention, there is provided a high-frequency electronic switch according to the first or second aspect of the invention, wherein the supply current control circuit (38) includes a plurality of constant current circuits (I1, I2, I3) which are connected to each of the transistors (Tr, Tr1, Tr2, Tr3, Tr4) of the plurality of amplifying circuits (37A, 37B, 37C), and makes the plurality of amplifying circuits (37A, 37B, 37C) be in an amplification-operational state or a non-amplification-operational state simultaneously or virtually simultaneously by making the plurality of constant current circuits (I1, I2, I3) be in an operational state or a non-operational state simultaneously or virtually simultaneously in accordance with a level of the pulse signal (Pa) input to the control terminal (36c).

Also, in order to achieve above object, according to a fourth aspect of the present invention, there is provided a high-frequency electronic switch according to the third aspect of the invention, wherein the high-frequency electronic switch is configured such that the plurality of constant current circuits (I1, I2, I3) of the supply current control circuit (38) are respectively composed of a plurality of constant current circuits (I1, I2, I3, I11, I12, I13, I14) with transistors (Q, Tr11, Tr12, Tr13, Tr14, Tr21, Tr22, Tr23, Tr24), and that the pulse signal (Pa) to the control terminal (36c) is supplied to each of bases of the transistors (Q, Tr11, Tr12, Tr13, Tr14, Tr21, Tr22, Tr23, Tr24) of the plurality of constant current circuits (I1, I2, I3, I11, I12, I13, I14).

Also, in order to achieve above object, according to a fifth aspect of the present invention, there is provided a high-frequency electronic switch according to the first or second aspect of the invention, wherein the supply current control circuit (38) includes: the plurality of constant current circuits (I1, I2, I3, I11, I12, I13, I14) which are connected to each of the transistors (Tr, Tr1, Tr2, Tr3, Tr4) of the plurality of amplifying circuits (37A, 37B, 37C); and a plurality of delay circuits (D1, D2, D3) which provide a delay corresponding to a delay in the high-frequency signal to be switched sequentially amplified in the plurality of amplifying circuits (37A, 37B, 37C) with respect to the pulse signal (Pa) to the control terminal (36c), and makes the plurality of constant current circuits (I1, I2, I3, I11, I12, I13, I14) be in an operational state or a non-operational state in a timewise staggered manner so as to correspond to the delay in the high-frequency signal in accordance with a level of the pulse signal (Pa) to the control terminal (36c).

Also, in order to achieve above object, according to a sixth aspect of the present invention, there is provided a high-frequency electronic switch according to the fifth aspect of the invention, wherein the high-frequency electronic switch is configured such that the plurality of constant current circuits (I1, I2, I3) of the supply current control circuit (38) are respectively constituted of a plurality of constant current circuits (I1, I2, I3, I11, I12, I13, I14) with transistors (Q, Tr11, Tr12, Tr13, Tr14, Tr21, Tr22, Tr23, Tr24), and that the pulse signal (Pa) to the control terminal (36c) is supplied to each of bases of the transistors (Q, Tr11, Tr12, Tr13, Tr14, Tr21, Tr22, Tr23, Tr24) of the plurality of constant current circuits (I1, I2, I3, I11, I12, I13, I14).

Also, in order to achieve above object, according to a seventh aspect of the present invention, there is provided a high-frequency electronic switch according to the second aspect of the invention, further comprising: a synthetic circuit (37D) which is connected between the positive-phase signal output terminal (36b) and the negative-phase signal output terminal (36b'), and which synthesizes and outputs the positive-phase and negative-phase high-frequency signals (C, C'), serving as the high-frequency signal to be switched (C), which are sequentially amplified at the plurality of amplifying circuits (37A, 37B, 37C) configured to be a differential type, and are output from the positive-phase signal output terminal (36b) and the negative-phase signal output terminal (36b'), when positive-phase and negative-phase high-frequency signals are respectively input as the high-frequency signal to be switched to the positive-phase signal input terminal (36a) and the negative-phase signal input terminal (36a').

In order to achieve the above object, according to an eighth aspect of the present invention, there is provided a burst wave generating device comprising:

a carrier signal generator (35) which continuously outputs a high-frequency carrier signal; and a high-frequency electronic switch (36) which outputs the high-frequency carrier signal (C) output from the carrier signal generator (35) in a burst form, or makes it be in an output-stopped state, wherein the high-frequency electronic switch (36) comprises:

a signal input terminal (36a) which receives the high-frequency carrier signal (C);

a plurality of amplifying circuits (37A, 37B, 37C) with transistors (Tr), to respectively amplify the high-frequency carrier signal (C) sequentially, the amplifying circuits being cascade-connected in a plurality of stages to the signal input terminal;

a signal output terminal (36e) which is connected to an output section of an amplifying circuit (37C) at final stage among the plurality of amplifying circuits (37A, 37B, 37C), and which outputs the high-frequency carrier signal (C) to be sequentially amplified;

a control terminal (36c) to which a pulse signal serving as a switching signal having a period of a first level and a period of a second level is input; and a supply current control circuit (38) which makes the plurality of amplifying circuits (37A, 37B, 37C) be in an amplification-operational state by supplying operational current to each of the transistors (Tr) of the plurality of amplifying circuits (37A, 37B, 37C) in a period when the pulse signal (Pa) to the control terminal (36c) is at the first level, and which makes the plurality of amplifying circuits (37A, 37B, 37C) be in a non-amplification-operational state by stopping supplying operational current to each of the transistors (Tr) of the plurality of amplifying circuits (37A, 37B, 37C) in a period when the pulse signal is at the second level, and the high-frequency carrier signal (C) is output in a burst form, or is made to be in an output-stopped state by turning on/off between the signal input terminal (36a) and the signal output terminal (36e) substantially high-frequency likewise in accordance with a level of the pulse signal (Pa) to the control terminal (36c) by the high-frequency electronic switch.

In order to achieve the above object, according to a ninth aspect of the present invention, there is provided a burst wave generating device according to the eighth aspect of the invention comprising:

a positive-phase signal input terminal (36a) and a negative-phase signal input terminal (36a') which are provided as the signal input terminal of the high-frequency electronic switch, and to which at least one of positive-phase and negative-phase high-frequency carrier signals (C, C') is input as the high-frequency carrier signal (C); and a positive-phase signal output terminal (36b) and a negative-phase signal output terminal (36b') which are provided as the signal output terminal (36e) of the high-frequency electronic switch (36), and from which at least one of the positive-phase and negative-phase high-frequency carrier signals (C, C') is output, wherein the plurality of amplifying circuits (37A, 37B, 37C) which are cascade-connected in a plurality of stages between the positive-phase signal input terminal (36a) and the negative-phase signal input terminal (36a'), and between the positive-phase signal output terminal (36b) and the negative-phase signal output terminal (36b'), are respectively configured to be a differential type with a plurality of transistors (Tr1, Tr2, Tr3, Tr4).

In order to achieve the above object, according to a tenth aspect of the present invention, there is provided a burst wave generating device according to the eighth or ninth aspect of the invention, wherein the supply current control circuit (38) of the high-frequency electronic switch (36) includes a plurality of constant current circuits (I1, I2, I3) which are connected to each of the transistors (Tr, Tr1, Tr2, Tr3, Tr4) of the plurality of amplifying circuits (37A, 37B, 37C), and makes the plurality of amplifying circuits (37A, 37B, 37C) be in an amplification-operational state or a non-amplification-operational state simultaneously or virtually simultaneously by making the plurality of constant current circuits (I1, I2, I3) be in an operational state or a non-operational state simultaneously or virtually simultaneously in accordance with a level of the pulse signal (Pa) to the control terminal (36c).

In order to achieve the above object, according to an eleventh aspect of the present invention, there is provided a burst wave generating device according to the tenth aspect of the invention, wherein the high-frequency electronic switch (36)

is configured such that the plurality of constant current circuits (I1, I2, I3) of the supply current control circuit (38) are respectively constituted of a plurality of constant current circuits (I1, I2, I3, I11, I12, I13, I14) with transistors (Q, Tr11, Tr12, Tr13, Tr14, Tr21, Tr22, Tr23, Tr24), and that the pulse signal (Pa) to the control terminal (36c) is supplied to each of bases of the transistors (Q, Tr11, Tr12, Tr13, Tr14, Tr21, Tr22, Tr23, Tr24) of the plurality of constant current circuits (I1, I2, I3, I11, I12, I13, I14).

In order to achieve the above object, according to a twelfth aspect of the present invention, there is provided a burst wave generating device according to the eighth or ninth aspect of the invention, wherein the supply current control circuit (38) of the high-frequency electronic switch (36) includes: a plurality of constant current circuits (I1, I2, I3, I11, I12, I13, I14) which are connected to each of the transistors (Tr, Tr1, Tr2, Tr3, Tr4) of the plurality of amplifying circuits (37A, 37B, 37C); and a plurality of delay circuits (D1, D2, D3) which provide a delay corresponding to a delay in the high-frequency carrier signal (C) to be sequentially amplified at the plurality of amplifying circuits (37A, 37B, 37C) with respect to the pulse signal (Pa) to the control terminal (36c), and makes the plurality of constant current circuits (I1, I2, I3) be in an operational state or a non-operational state in a timewise staggered manner so as to correspond to the delay in the high-frequency carrier signal (C) in accordance with a level of the pulse signal (Pa) to the control terminal (36c).

In order to achieve the above object, according to a thirteen aspect of the present invention, there is provided a burst wave generating device according to the twelfth aspect of the invention, wherein the high-frequency electronic switch (36) is configured such that the plurality of constant current circuits (I1, I2, I3) of the supply current control circuit (38) are respectively constituted of a plurality of constant current circuits (I1, I2, I3, I11, I12, I13, I14) with transistors (Q, Tr11, Tr12, Tr13, Tr14, Tr21, Tr22, Tr23, Tr24), and that the pulse signal (Pa) to the control terminal (36c) is supplied to each of bases of the transistors (Q, Tr11, Tr12, Tr13, Tr14, Tr21, Tr22, Tr23, Tr24) of the plurality of constant current circuits (I1, I2, I3, I11, I12, I13, I14).

In order to achieve the above object, according to a fourteenth aspect of the present invention, there is provided a burst wave generating device according to the ninth aspect of the invention, wherein the high-frequency electronic switch (36) further comprises a synthetic circuit which is connected between the positive-phase signal output terminal (36b) and the negative-phase signal output terminal (36b'), and which synthesizes and outputs the positive-phase and negative-phase high-frequency carrier signals serving as the high-frequency carrier signal (C), which are sequentially amplified at the plurality of amplifying circuits (37A, 37B, 37C) configured to be a differential type, and which are output from the positive-phase signal output terminal (36b) and the negative-phase signal output terminal (36b') when positive-phase and negative-phase high-frequency carrier signals (C, C') are respectively input as the high-frequency carrier signal (C) to the positive-phase signal input terminal (36a) and the negative-phase signal input terminal (36a').

In order to achieve the above object, according to a fifteenth aspect of the present invention, there is provided a short range radar comprising:

a transmitting unit (31) which has a burst wave generating device (34) including a carrier signal generator (36) which continuously outputs a high-frequency carrier signal (C) in order to emit a short pulse wave (Pt) with a predetermined width into a space (1) every time a transmission trigger (G) signal is received, and a high-frequency electronic switch (36) which outputs the high-frequency carrier signal (C) output from the carrier signal generator (35) in a burst form, or makes it be in an output-stopped state;

a receiving unit (40) which performs receiving and wave detecting processing onto a reflected wave (Pr) of the short pulse wave (Pt);

a signal processing unit (50) which performs analysis processing on an object (1a) existing in the space (1) based on an output from the receiving unit (40); and a control unit (60) which performs predetermined control onto at least one of the transmitting unit (31) and the receiving unit (40) based on an analysis result from the signal processing unit (50), wherein the high-frequency electronic switch (36) of the burst wave generating device (34) comprises:

a signal input terminal (36a) which receives the high-frequency carrier signal (C);

a plurality of amplifying circuits (37A, 37B, 37C) with transistors (Tr), to respectively amplify the high-frequency carrier signal (C) sequentially, the amplifying circuits being cascade-connected in a plurality of stages to the signal input terminal (36a);

a signal output terminal (36e) which is connected to an output section of an amplifying circuit at final stage among the plurality of amplifying circuits (37A, 37B, 37C), and which outputs the high-frequency carrier signal (C) to be sequentially amplified;

a control terminal (36c) to which a pulse signal serving as a switching signal having a period of a first level and a period of a second level is input; and a supply current control circuit (38) which makes the plurality of amplifying circuits (37A, 37B, 37C) be in an amplification-operational state by supplying operational current to each of the transistors (Tr) of the plurality of amplifying circuits (37A, 37B, 37C) in a period when the pulse signal (Pa) to the control terminal (36c) is at the first level, and which makes the plurality of amplifying circuits (37A, 37B, 37C) be in a non-amplification-operational state by stopping supplying operational-current to each of the transistors (Tr) of the plurality of amplifying circuits (37A, 37B, 37C) in a period when the pulse signal is at the second level, and the high-frequency carrier signal (C) is output in a burst form, or is made to be in an output-stopped state by turning on/off state between the signal input terminal and the signal output terminal substantially high-frequency likewise in accordance with a level of the pulse signal (Pa) to the control terminal (36c) by the high-frequency electronic switch (36).

In order to achieve the above object, according to a sixteenth aspect of the present invention, there is provided a short range radar according to the fifteenth aspect of the invention, comprising:

a positive-phase signal input terminal (36a) and a negative-phase signal input terminal (36a') which are provided as the signal input terminal (36a) of the high-frequency electronic switch (36), and to which at least one of positive-phase and negative-phase high-frequency carrier signals (C, C') is input as the high-frequency carrier signal (C); and a positive-phase signal output terminal (36b) and a negative-phase signal output terminal (36b') which are provided as the signal output terminal of the high-frequency electronic switch (36), and from which at least one of the positive-phase and negative-phase high-frequency carrier signals (C, C') is output, wherein the plurality of amplifying circuits (37A, 37B, 37C) which are cascade-connected in a plurality of stages between the positive-phase signal input terminal (36a) and the negative-phase signal input terminal (36a'), and between the positive-phase signal output terminal (36b) and the negative-phase signal output terminal (36b'), are respectively configured to be a differential type with a plurality of transistors (Tr1, Tr2, Tr3, Tr4).

In order to achieve the above object, according to a seventeenth aspect of the present invention, there is provided a short range radar according to the fifteenth or sixteenth aspect of the invention, wherein the supply current control circuit (38) of the high-frequency electronic switch (36) includes a plurality of constant current circuits (I1, I2, I3, I11, I12, I13, I14) which are connected to each of the transistors (Tr, Tr1, Tr2, Tr3, Tr4) of the plurality of amplifying circuits (37A, 37B, 37C), and makes the plurality of amplifying circuits (37A, 37B, 37C) be in an amplification-operational state or a non-amplification-operational state simultaneously or virtually simultaneously by making the plurality of constant current circuits (I1, I2, I3, I11, I12, I13, I14) be in an operational state or a non-operational state simultaneously or virtually simultaneously in accordance with a level of the pulse signal (Pa) to the control terminal (36c).

In order to achieve the above object, according to an eighteenth aspect of the present invention, there is provided a short range radar according to the seventeenth aspect of the invention, wherein the high-frequency electronic switch (36) is configured such that the plurality of constant current circuits (I1, I2, I3) of the supply current control circuit (38) are respectively constituted of a plurality of constant current circuits (I1, I2, I3, I11, I12, I13, I14) with transistors (Q, Tr11, Tr12, Tr13, Tr14, Tr21, Tr22, Tr23, Tr24), and the pulse signal (Pa) to the control terminal (36c) is supplied to each of bases of the transistors (Q, Tr11, Tr12, Tr13, Tr14, Tr21, Tr22, Tr23, Tr24) of the plurality of constant current circuits (I1, I2, I3, I11, I12, I13, I14).

In order to achieve the above object, according to a nineteenth aspect of the present invention, there is provided a short range radar according to the fifteenth or sixteenth aspect of the invention, wherein the supply current control circuit (38) of the high-frequency electronic switch (36) includes: a plurality of constant current circuits (I1, I2, I3) which are connected to each of the transistors (Tr, Tr1, Tr2, Tr3, Tr4) of the plurality of amplifying circuits (37A, 37B, 37C); and a plurality of delay circuits (D1, D2, D3) which provide a delay corresponding to a delay in the high-frequency carrier signal (C) to be sequentially amplified at the plurality of amplifying circuits (37A, 37B, 37C) with respect to the pulse signal (Pa) to the control terminal (36c), and makes the plurality of constant current circuits (I1, I2, I3) be in an operational state or a non-operational state in a timewise staggered manner so as to correspond to the delay in the high-frequency carrier signal (C) in accordance with a level of the pulse signal (Pa) to the control terminal (36c).

In order to achieve the above object, according to a twentieth aspect of the present invention, there is provided a short range radar according to the nineteenth aspect of the invention, wherein the high-frequency electronic switch (36) is configured such that the plurality of constant current circuits (I1, I2, I3) of the supply current control circuit (38) are respectively constituted of a plurality of constant current circuits (I1, I2, I3, I11, I12, I13, I14) with transistors (Q, Tr11, Tr12, Tr13, Tr14, Tr21, Tr22, Tr23, Tr24), and that the pulse signal (Pa) to the control terminal (36c) is supplied to each of bases of the transistors (Q, Tr11, Tr12, Tr13, Tr14, Tr21, Tr22, Tr23, Tr24) of the plurality of constant current circuits (I1, I2, I3, I11, I12, I13, I14).

In order to achieve the above object, according to a twenty-first aspect of the present invention, there is provided a short range radar according to the sixteenth aspect of the invention, wherein the high-frequency electronic switch (36) further comprises a synthetic circuit which is connected between the positive-phase signal output terminal (36b) and the negative-phase signal output terminal (36b'), and which synthesizes and outputs the positive-phase and negative-phase high-frequency carrier signals (C, C') serving as the high-frequency carrier signal (C), which are sequentially amplified at the plurality of amplifying circuits (37A, 37B, 37C) configured to be a differential type, and which are output from the positive-phase signal output terminal (36b) and the negative-phase signal output terminal (36b') when positive-phase and negative-phase high-frequency carrier signals (C, C') are respectively input as the high-frequency carrier signal (C) to the positive-phase signal input terminal (36a) and the negative-phase signal input terminal (36a7).

In this way, the high-frequency electronic switch 36 of the present invention is configured such that the plurality of amplifying circuits 37A, 37B and 37C with the transistors which can control to supply operating current are cascade-connected in a plurality of stages between the signal input terminal 36a and the signal output terminal 36e. As a consequence, isolations in a plurality of stages can be obtained, and it is possible to sufficiently suppress leakage of high-frequency carrier signal in off state even within a frequency band of UWB higher than the RR prohibited band of emitting radiowaves.

Further, when the high-frequency electronic switch 36 is used for the burst wave generating device 34, leakage of carrier can be prevented. When, the high-frequency electronic switch 36 is used for the radar system 30, an electric power of the transmitted pulse thereof can be effectively used.

Moreover, in the high-frequency electronic switch 36 in which the respective amplifying circuits 37A, 37B and 37C are configured to be a differential type, higher isolation can be obtained due to the cancellation effect with respect to leakage components in off state in the amplifying circuits 37A, 37B and 37C because the amplifying circuits 37A, 37B and 37C are configured to be a differential type, so that leakage can be more effectively suppressed.

Accordingly, electric power of the transmitted pulse thereof can be more effectively used to the extent that when the high-frequency electronic switch 36 configured to be a differential type is used for the burst wave generating device 34, leakage of carrier can be further prevented, and when the high-frequency electronic switch 36 is used for the radar system 30, leakage can be more effectively suppressed.

BRIEF DESCRIPTION OF DRAWINGS

FIG. 2A is a block diagram illustrating a circuit configuration of a high-frequency electronic switch as the configuration of a principal part of the embodiment in FIG. 1.

FIG. 2B is a block diagram showing a modified example of the circuit configuration of the high-frequency electronic switch as the configuration of the principal part of the embodiment in FIG. 1.

FIG. 3A is a circuit diagram showing a concrete example of the high-frequency electronic switch as the configuration of the principal part of the embodiment in FIG. 1.

BEST MODE FOR CARRYING OUT THE INVENTION

Hereinafter, an embodiment of the present invention will be described with reference to the drawings.

Figure 1:
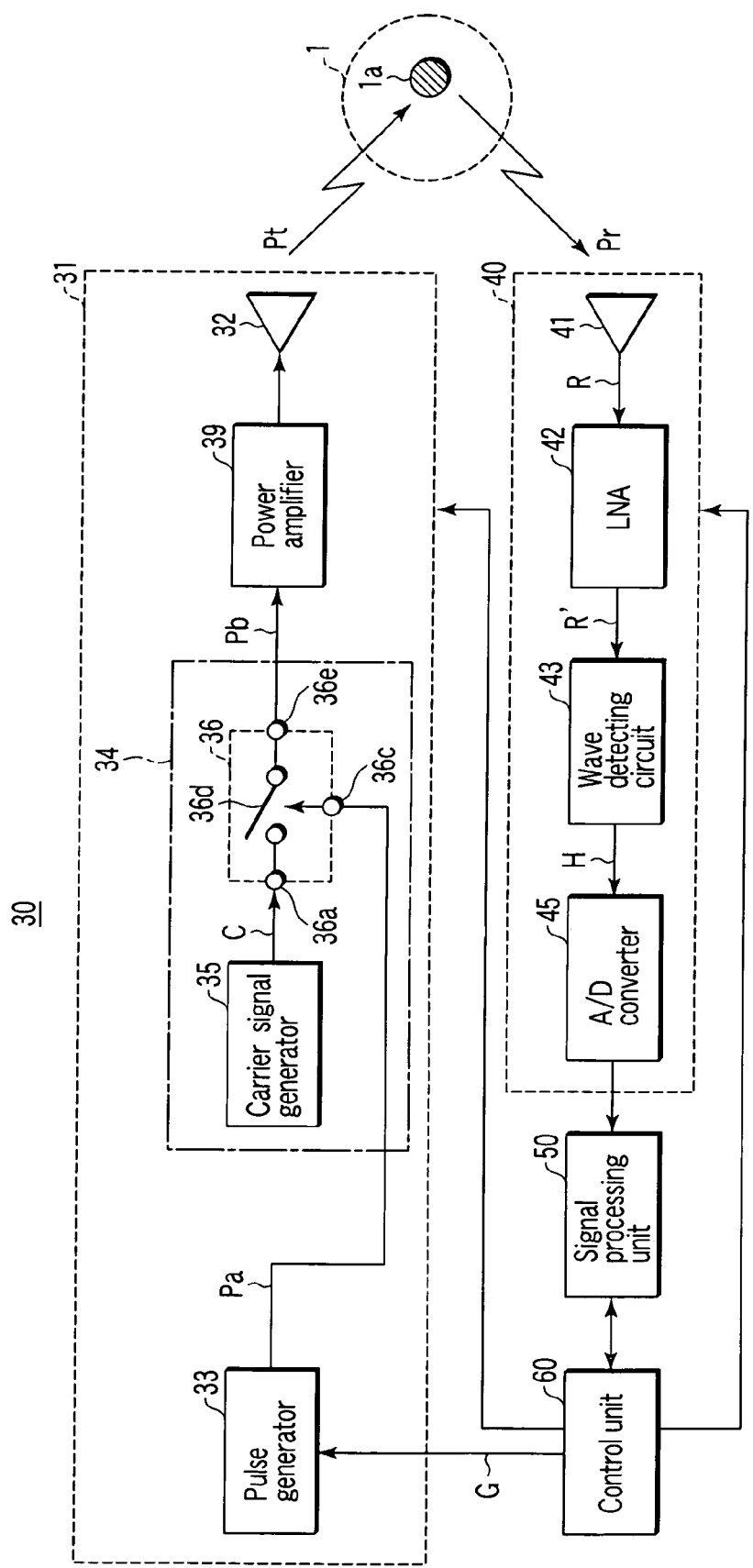
FIG. 1 is a block diagram showing a configuration of a short range radar 30 which is applied as an embodiment of the present invention.

FIG. 1 shows a block configuration of a short range radar 30 to which the present invention is applied.

The short range radar 30 includes a transmitting unit 31, a receiving unit 40, a signal processing unit 50, and a control unit 60.

The transmitting unit 31 generates a short pulse wave Pt with a predetermined width Tp and a predetermined carrier frequency Fc (for example, 26 GHz), and emits it into a space 1 from the transmitting antenna 32 every time a trigger signal G output in a predetermined cycle Tg from the control unit 60 is received.

Note that the transmitting antenna 32 is used commonly with a receiving antenna 41 which will be described later.

The transmitting unit 31 has a pulse generator 33 which generates a pulse signal Pa with a width Tp which is synchronous with a trigger signal G from the control unit 60, a burst wave generating device 34 which outputs a carrier signal with a carrier frequency Fc so as to be a burst form only for a time Tp of receiving a pulse signal Pa from the pulse generator 33, and a power amplifier 39 which amplifies a burst wave output from the burst wave generating device 34, and supplies it to the transmitting antenna 32.

The burst wave generating device 34 includes a carrier signal generator 35 which continuously outputs a carrier signal C with a frequency Fc, and a high-frequency electronic switch 36 (the details thereof will be described later). The high-frequency electronic switch 36 receives a carrier signal C from the carrier signal generator 35 by a signal input terminal 36a, and receives a pulse signal Pa from the pulse generator 33 by a control terminal 36c, thereby turning on/off substantially high-frequency likewise between the signal input terminal 36a and a signal output terminal 36e in accordance with a level of the pulse signal Pa.

Namely, the burst wave generating device 34 outputs a burst wave Pb having a carrier signal with a predetermined frequency to the control terminal 36c of the high-frequency electronic switch 36 in a period when a pulse signal Pa from the pulse generator 33 is being input (for example, a period at a high level of a pulse signal Pa: first level). In addition, the burst wave generating device 34 stops outputting a burst wave Pb having the carrier signal in a period when a pulse signal Pa is not being input (for example, a period at a low level of a pulse signal Pa: second level).

FIG. 2A is a block diagram illustrating a circuit configuration of the high-frequency electronic switch 36 as a configuration of a principal part of the embodiment of FIG. 1.

Namely, the high-frequency electronic switch 36 shown in FIG. 2A is constituted of a plurality of amplifying circuits 37A, 37B and 37C which respectively have transistors Tr for sequentially amplifying a carrier signal C with a high frequency, and which are cascade-connected in a plurality of stages (here, in three stages) between the signal input terminal 36a and the signal output terminal 36e, and a supply current control circuit 38 which supplies electric current required for each of the transistors Tr of the plurality of amplifying circuits 37A, 37B and 37C to operate, and which controls the current supply based on a pulse signal Pa input from the control terminal 36c.

The supply current control circuit 38 has a plurality of constant current circuits I1, I2 and I3 which are connected to each of the transistors Tr of the plurality of amplifying circuits 37A, 37B and 37C, and which supply operational electric current (bias current) to each of the transistors Tr of the plurality of amplifying circuits 37A, 37B and 37C, the constant current circuits I1, I2 and I3 capable of tuning on and off. A pulse signal Pa input from the control terminal 36c is provided to the constant current circuits I1, I2 and I3 to allow the plurality of constant current circuits I1, I2 and I3 to made to be in an operational state or a non-operational state simultaneously or virtually simultaneously in accordance with a level of the pulse signal Pa.

As a consequence, the high-frequency electronic switch 36 makes a carrier signal C intermittent by making the plurality of amplifying circuits 37A, 37B and 37C be in an amplification-operational state or a non-amplification-operational state simultaneously or virtually simultaneously by switching on and off the transistors Tr of the plurality of amplifying circuits 37A, 37B and 37C simultaneously or virtually simultaneously.

Namely, the high-frequency electronic switch 36 receives a carrier signal C input from the signal input terminal 36a by the amplifying circuit 37A at the first stage among the plurality of amplifying circuits 37A, 37B and 37C. When the high-frequency electronic switch 36 is in an operational (on-operating) state, the input carrier signal C is inverted and amplified at the amplifying circuit 37A at the first stage, and is output to the amplifying circuit 37B at the second stage.

Further, the carrier signal C amplified at the amplifying circuit 37A at the first stage is input to the amplifying circuit 37B at the second stage. When the high-frequency electronic switch 36 is in an operational (on-operating) state, the input carrier signal C is inverted and amplified, and is output to the amplifying circuit 37C at the final stage.

Then, the carrier signal C amplified at the amplifying circuit 37B at the second stage is input to the amplifying circuit 37C at the final stage. When the high-frequency electronic switch 36 is in an operational (on-operating) state, the input carrier signal C is inverted and amplified, and is output to the signal output terminal 36e.

Here, operational electric current (bias current) of each of the transistors Tr of the plurality of amplifying circuits 37A, 37B and 37C are supplied by the constant current circuits I1, I2 and I3 of the supply current control circuit 38 connected to each of the transistors Tr in order to make the high-frequency electronic switch 36 be in an operational (on-operating) state.

These constant current circuits I1, I2 and I3 are constituted of transistors (Q) capable of operating in on/off state (refer to FIG. 2B).

Then, each of the transistors (Q) of the constant current circuits I1, I2 and I3 are made to be in on (operational) state via a buffer 38a from the control terminal 36c in a period when a pulse signal Pa input to each of bases the transistors is at a high level (first level)

As a consequence, when the plurality of amplifying circuits 37A, 37B and 37C are made to be in an amplification-operational state by supplying operational current to the transistors Tr thereof, the high-frequency electronic switch 36 is made to be in an operational (on-operating) state, and turns, on state between the signal input terminal 36*a* and the signal output terminal 36*e* substantially high-frequency likewise, so that a carrier signal C sequentially amplified by the plurality of amplifying circuits 37A, 37B and 37C is made to pass through.

Further, each of the transistors (Q) of the constant current circuits I1, I2 and I3 are made to be in an off (non-operational) state in a period when a pulse signal Pa is at a low level (second level).

As a consequence, when the plurality of amplifying circuits 37A, 37B and 37C are made to be in a non-amplification-operational state by stopping supplying operational current to each of the transistors Tr thereof, the high-frequency electronic switch 36 is made to be in a non-operational (off-operating) state, and turns off between the signal input terminal 36*a* and the signal output terminal 36*e* substantially high-frequency likewise, i.e., isolation is carried out, which prevents a carrier signal C from passing through.

Accordingly, in a period when the high-frequency electronic switch 36 is in a non-operational (off-operating) state, leakage of carrier signal C can be effectively suppressed.

In this case, the high-frequency electronic switch 36 is configured such that the plurality of amplifying circuits 37A, 37B and 37C with the transistors Tr which can control to supply operational current are cascade-connected in a plurality of stages between the signal input terminal 36*a* and the signal output terminal 36*e*. Consequently, isolations in a plurality of stages can be obtained, and leakage of high-frequency carrier signal in off state can be sufficiently suppressed even within a UWB frequency band or the like which is higher than the RR radiowave emission prohibited band described above.

Namely, the high-frequency electronic switch 36 shown in FIG. 2A basically includes the signal input terminal 36*a* to which a high-frequency signal C to be switched is input, the plurality of amplifying circuits 37A, 37B and 37C with the transistors Tr which are cascade-connected in a plurality of stages to the signal input terminal 36*a*, and which are for respectively amplifying the high-frequency signal to be switched sequentially, the signal output terminal 36*e* which is connected to an output section of the amplifying circuit 37C at the final stage among the plurality of amplifying circuits 37A, 37B and 37C, and which outputs the high-frequency signal Pb to be switched sequentially amplified, the control terminal 36*c* to which a pulse signal Pa having a period of a first level and a period of a second level as a switching signal is input, and the supply current control circuit 38 which makes the plurality of amplifying circuits 37A, 37B and 37C be in an amplification-operational state by supplying operational current to each of the transistors Tr of the plurality of amplifying circuits 37A, 37B and 37C when the pulse signal Pa input to the control terminal 36*c* is within a period at the first level, and which makes the plurality of amplifying circuits 37A, 37B and 37C be in a non-amplification-operational state by stopping supplying operational current to each of the transistors Tr of the plurality of amplifying circuits 37A, 37B and 37C when the pulse signal Pa is within a period at the second level. The high-frequency electronic switch 36 turns on/off between the signal input terminal 36*a* and the signal output terminal 36*e* substantially high-frequency likewise in accordance with a level of the pulse signal Pa input to the control terminal 36*c*.

Further, in the high-frequency electronic switch 36 shown in FIG. 2A, more preferably, the supply current control circuit 38 includes the plurality of constant current circuits I1, I2 and I3 which are connected to each of the transistors Tr of the plurality of amplifying circuits 37A, 37B and 37C. The plurality of constant current circuits I1, I2 and I3 are made to be in an operational state or a non-operational state simultaneously or virtually simultaneously in accordance with a level of the pulse signal Pa input to the control terminal 36*c*, whereby the plurality of amplifying circuits 37A, 37B and 37C are made to be in an amplification-operational state or a non-amplification-operational state simultaneously or virtually simultaneously.

FIG. 2B is a block diagram showing a modified example of the circuit configuration of the high-frequency electronic switch 36 as a configuration of a principal part of the embodiment of FIG. 1.

The high-frequency electronic switch 36 shown in FIG. 2B is constituted of the plurality of amplifying circuits 37A, 37B and 37C which respectively have transistors Tr for amplifying a carrier signal C with a high frequency, and which are cascade-connected in a plurality of stages (here, in three stages) between the signal input terminal 36*a* and the signal output terminal 36*e*, and a supply current control circuit 38' which supplies electric current required for each of the transistors Tr of the plurality of amplifying circuits 37A, 37B and 37C to operate, and which controls the current supply based on a pulse signal Pa input from the control terminal 36*c*.

The supply current control circuit 38' includes the plurality of constant current circuits I1, I2 and I3 which are connected to each of the transistors Tr of the plurality of amplifying circuits 37A, 37B and 37C, and which are constituted of transistors Q which supply operational electric current (bias current) to each of the transistors Tr of the plurality of amplifying circuits 37A, 37B and 37C, each of the transistor Q capable of operating on and off, and a plurality of delay circuits D1, D2, and D3 which provide a delay corresponding to a delay in the high-frequency carrier signal sequentially amplified at the plurality of amplifying circuits 37A, 37B and 37C with respect to a pulse signal Pa input to the control terminal 36*c*. The plurality of constant current circuits I1, I2 and I3 are made to be in an operational state or a non-operational state in a timewise staggered manner so as to correspond to the delay in the high-frequency carrier signal in accordance with a level of the pulse signal Pa input to the control terminal 36*c*.

As a consequence, the high-frequency electronic switch 36 makes a carrier signal C intermittent by making the plurality of amplifying circuits 37A, 37B and 37C be in an amplification-operational state or a non-amplification-operational state in a timewise staggered manner so as to correspond to the delay in the high-frequency carrier signal by switching on and off the transistors Tr of the plurality of amplifying circuits 37A, 37B and 37C in a timewise staggered manner so as to correspond to the delay in the high-frequency carrier signal.

This makes it possible to effectively suppress waveform distortion which tends to be brought about in a rising portion and a trailing portion of a carrier signal C output from the signal output terminal 36*e* when the plurality of constant current circuits I1, I2 and I3 are made to be in an operational state or a non-operational state simultaneously or virtually simultaneously in accordance with a level of a pulse signal input to the control terminal 36*c* as the high-frequency electronic switch 36 in FIG. 2A described above.

Namely, the high-frequency electronic switch 36 shown in FIG. 2B basically includes the signal input terminal 36*a* to which a high-frequency signal C to be switched is input, the plurality of amplifying circuits 37A, 37B and 37C with the transistors Tr which are cascade-connected in a plurality of stages to the signal input terminal 36*a*, and which respectively amplify the high-frequency signal to be switched sequentially, the signal output terminal 36e which is connected to an output section of the amplifying circuit 37C at the final stage among the plurality of amplifying circuits 37A, 37B and 37C, and which outputs the high-frequency signal Pb to be switched to be sequentially amplified, the control terminal 36c to which a pulse signal Pa having a period at a first level and a period at a second level as a switching signal is input, and the supply current control circuit 38' which makes the plurality of amplifying circuits 37A, 37B and 37C be in an amplification-operational state by supplying operational current to each of the transistors Tr of the plurality of amplifying circuits 37A, 37B and 37C when a pulse signal Pa input to the control terminal 36c is within a period at the first level, and which makes the plurality of amplifying circuits 37A, 37B and 37C be in a non-amplification-operational state by stopping supplying operational current to each of the transistors Tr of the plurality of amplifying circuits 37A, 37B and 37C when the pulse signal Pa is within a period at the second level. The high-frequency electronic switch 36 turns on/off between the signal input terminal 36a and the signal output terminal 36e substantially high-frequency likewise in accordance with a level of the pulse signal Pa input to the control terminal 36c.

Further, in the high-frequency electronic switch 36 shown in FIG. 2B, more preferably, the supply current control circuit 38' includes the plurality of constant current circuits I1, I2 and I3 connected to each of the transistors Tr of the plurality of amplifying circuits 37A, 37B and 37C, and the plurality of delay circuits D1, D2, and D3 which provide a delay corresponding to a delay in the high-frequency signal C to be switched sequentially amplified at the plurality of amplifying circuits 37A, 37B and 37C with respect to a pulse signal Pa input to the control terminal 36c, and makes the plurality of constant current circuits 11, 12 and 13 be in an operational state or a non-operational state in a timewise staggered manner so as to correspond to the delay in the high-frequency carrier signal C in accordance with a level of the pulse signal Pa input to the control terminal 36c.

As described above, the high-frequency electronic switch 36 shown in FIGS. 2A and 2B has the configuration in which the plurality of amplifying circuits 37A, 37B, and 37c with the transistors by which supply of operational current can be controlled to be on/off based on a pulse signal Pa are cascade-connected. As a result, leakage of carrier signal in OFF state can be effectively suppressed to the extent of a number of the stages of the plurality of amplifying circuits 37A, 37B and 37C.

FIG. 3A is a diagram showing a more concrete configuration of the plurality of amplifying circuits 37A, 37B and 37C of the high-frequency electronic switch 36.

The high-frequency electronic switch 36 in FIG. 3A is configured such that positive-phase and negative-phase carrier signals C and C' whose phases are respectively inverted, the signals being output from the carrier signal generator 35, are received at a positive-phase signal input terminal 36a and a negative-phase signal input terminal 36a'. In addition, the high-frequency electronic switch 36 is configured such that, when the high-frequency electronic switch 36 is in on-operating, these positive-phase and negative-phase carrier signals C and C' are respectively amplified sequentially at the plurality of amplifying circuits 37A, 37B and 37C configured to be a differential type with a plurality of transistors Tr1, Tr2, Tr3 and Tr4, and positive-phase and negative-phase burst waves Pb and Pb' are output from a positive-phase signal output terminal 36b and a negative-phase signal output terminal 36b'.

In this case, the high-frequency electronic switch 36 has a synthetic circuit 37D. The synthetic circuit 37D is connected between a positive-phase output section and a negative-phase output section of the amplifying circuit 37C at the final stage among the plurality of amplifying circuits 37A, 37B and 37C configured to be a differential type, that is, the positive-phase signal output terminal 36b and the negative-phase signal output terminal 36b'. Also, the synthetic circuit 37D synthesizes the positive-phase and negative-phase burst waves Pb and Pb' sequentially amplified, which are output from the positive-phase signal output terminal 36b and the negative-phase signal output terminal 36b', to be output from the signal output terminal 36e.

As the synthetic circuit 37D, a lumped parameter circuit with a balun circuit, a distributed constant circuit with a microstrip line, or the like can be used.

Consequently, a burst wave Pb (i.e., a component whose amplitude has increased to be double) in which positive-phase and negative-phase burst waves Pb and Pb' whose phases are respectively inverted is differentially synthesized by the synthetic circuit 37D is to be input from the signal output terminal 36e to the power amplifier 39 in FIG. 1. The positive-phase and negative phase burst waves Pb and Pb' are output from the positive-phase signal output terminal 36b and the negative-phase signal output terminal 36b' via the positive-phase output section and the negative-phase output section of the amplifying circuit 37C at the final stage among the plurality of amplifying circuits 37A, 37B and 37C configured to be a differential type in the high-frequency electronic switch 36

Accordingly, in this case, a burst wave Pb whose amplitude has increased to be double is input to the power amplifier 39, and therefore, an amplification degree of the power amplifier 39 can be reduced to that extent.

As shown in FIG. 3A, in the high-frequency electronic switch 36, the plurality of amplifying circuits 37A, 37B and 37C configured to be a differential type are respectively configured so as to receive input signals whose phases are inverted by emitter-followers with the transistors Tr1 and Tr3, and to respectively invert and amplify (an amplification degree with respect to small amplitude is several dB) outputs from the emitter-followers with the transistors Tr1 and Tr3 by the two transistors Tr2 and Tr4 which are connected differentially, and to output those.

Note that, in FIG. 3A, reference numeral Ra is an input matching resistance (for example, 50Ω), and reference numeral RL is a load resistance (for example, 50Ω).

Further, reference numeral Ck is a capacitor which connects between the both emitters of the transistors Tr2 and Tr4 substantially high-frequency likewise. In the case of this embodiment, a signal frequency is within a GHz band which is high, and thus, a capacitor whose capacitance value is 1 pF or less is used.

Further, when the high-frequency electronic switch 36 the signal including low-frequency component is turned on/off, it may be configured such that a capacitance of the capacitor Ck is made larger, or the emitters of the transistors Tr2 and Tr4 are directly connected without using a capacitor, which makes it possible to amplify from DC component.

The high-frequency electronic switch 36 receives positive-phase and negative-phase carrier signals C and C' which are input from the positive-phase signal input terminal 36a and the negative-phase signal input terminal 36a' at the amplifying circuit 37A at the first stage among the plurality of amplifying circuits 37A, 37B and 37C configured to be a differential type. When the high-frequency electronic switch 36 is in an operational (on-operating) state, the input positive-phase and negative-phase carrier signals C and C' are inverted and amplified at the at the amplifying circuit 37A at the first stage, and are output to the amplifying circuit 37B at the second stage.

Further, the carrier signals C and C' amplified at the amplifying circuit 37A at the first stage are input to the amplifying circuit 37B at the second stage. When the high-frequency electronic switch 36 is in an operational (on-operating) state, the input positive-phase and negative-phase carrier signals C and C' are inverted and amplified, and are output to the amplifying circuit 37C at the final stage.

Then, the carrier signals C and C' amplified at the amplifying circuit 37B at the second stage are input to the amplifying circuit 37C at the final stage. When the high-frequency electronic switch 36 is in an operational (on-operating) state, the input positive-phase and negative-phase carrier signals C and C' are inverted and amplified, and are output to the positive-phase signal output terminal 36b and the negative-phase signal output terminal 36b'.

Operational current (bias current) of each of the transistors Tr1, Tr2, Tr3 and Tr4 of the plurality of amplifying circuits 37A, 37B and 37C configured to be a differential type is supplied by each of the constant current circuits I1, I2 and I3 of the supply current control circuit 38 connected to each of the transistors Tr1, Tr2, Tr3 and Tr4 of the plurality of amplifying circuits 37A, 37B and 37C.

In this case, four constant current circuits I11, I12, I13 and I14 connected between each of the transistors Tr1, Tr2, Tr3 and Tr4 for each of the plurality of amplifying circuits 37A, 37B and 37C, and respective negative bias supplies Ve are respectively provided to each of the constant current circuits 11, 12 and 13 of the supply current control circuit 38.

Figure 3B:
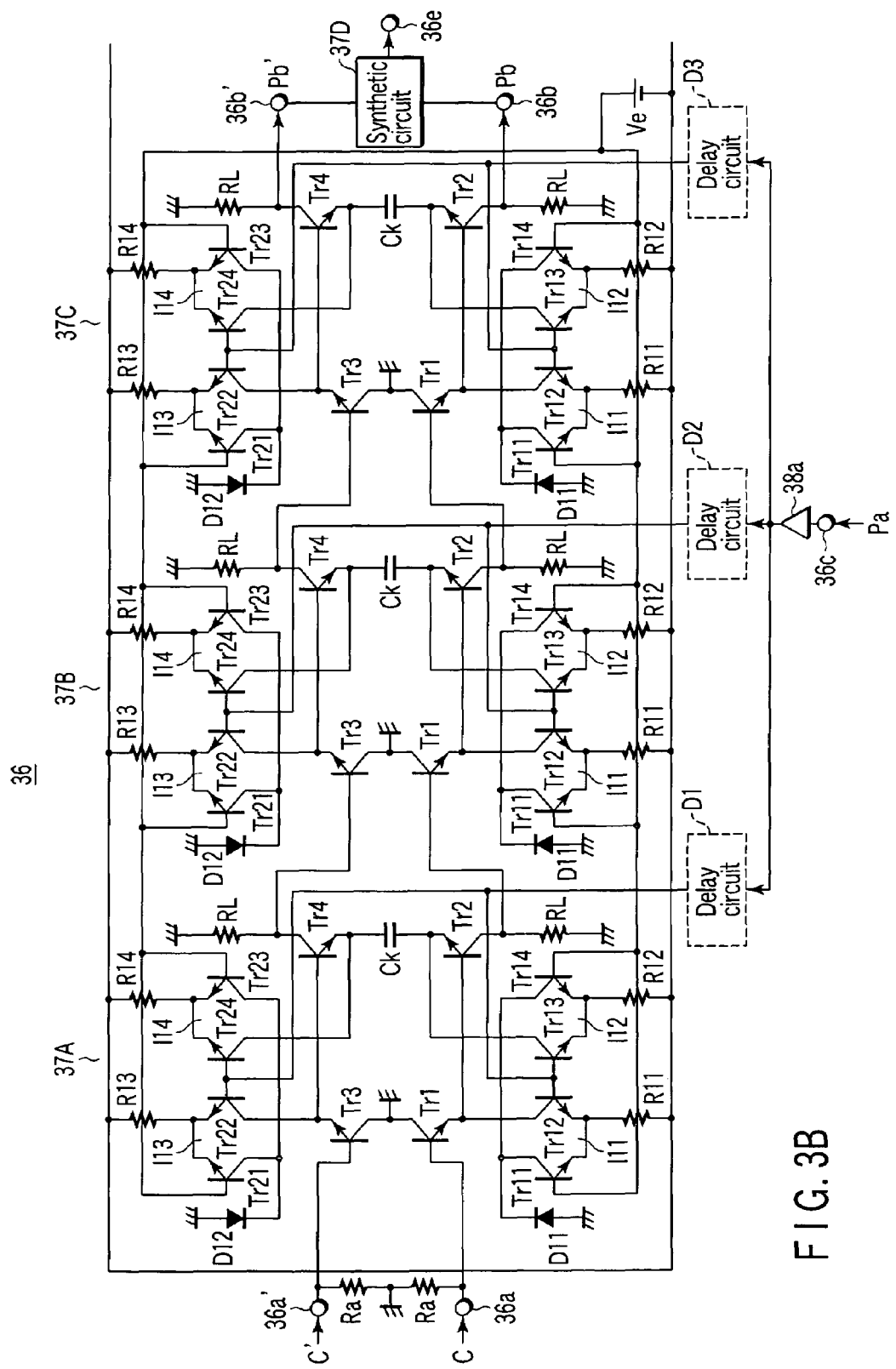
FIG. 3B is a circuit diagram showing a more detailed concrete example of the high-frequency electronic switch as the configuration of the principal part of the embodiment in FIG. 1.

FIG. 3B is a circuit diagram showing a more detailed concrete example of the high-frequency electronic switch 36 as a configuration of the principal part of the embodiment of FIG. 1.

Note that, in FIG. 3B, the same components as those of the high-frequency electronic switch 36 shown in FIG. 3A described above are denoted by the same reference numerals, and explanations thereof omitted.

In the high-frequency electronic switch 36 shown in FIG. 3B, the two constant current circuits I11 and I12 in the under side in the drawing among the four constant current circuits I11, I12, I13 and I14 provided to the respective constant current circuits I1, I2 and I3 connected to each of the transistors Tr1, Tr2, Tr3 and Tr4 of the plurality of amplifying circuits 37A, 37B and 37C configured to be a differential type, are constituted of the transistors Tr11, Tr12, Tr13, and Tr14 each capable of operating on/off.

Further, the two constant current circuits 113 and 114 in the upper part of the drawing are constituted of transistors Tr21, Tr22, Tr23, and Tr24 each capable of operating on/off.

Note that, in FIG. 3B, reference numerals R11 and R12 are common emitter bias resistances for every transistors Tr1l and Tr12, and Tr13 and Tr14.

Further, in FIG. 3B, reference numerals R13 and R14 are common emitter bias resistances for every transistors Tr21 and Tr22, and Tr23 and Tr24.

Further, reference numerals D11 and D12 are diodes commonly connected to respective collectors of the transistors Tr1l and Tr14, and Tr21 and Tr24.

Then, in a period when a pulse signal Pa input to each of the bases of the transistors Tr11, Tr12, Tr13, Tr14, and Tr21, Tr22, Tr23, Tr24 of the constant current circuits I11, I12, I13 and I14 via the buffer 38a from the control terminal 36c is at a high level (first level), the high-frequency electronic switch 36 is made to be in an on (operational) state to turn on those by supplying operational current.

As a consequence, positive-phase and negative-phase carrier signals C and C' sequentially amplified by the plurality of amplifying circuits 37A, 37B and 37C pass through by turning on between the positive-phase signal input terminal 36a and the negative-phase input terminal 36a', and the positive-phase signal output terminal 36b and the negative-phase output terminal 36b'are closed substantially high-frequency likewise.

Note that the positive-phase and negative-phase carrier signals C and C' which have passed through the positive-phase signal output terminal 36b and the negative-phase output terminal 36b' are output as a burst wave Pb which has been differentially synthesized by the synthetic circuit 37D as described above (namely, a component whose amplitude has increased to be double) from the signal output terminal 36e.

Further, in a period when a pulse signal Pa input to each of the bases of the transistors Tr11, Tr12, Tr13, Tr14, and Tr21, Tr22, Tr23, Tr24 of the constant current circuits I11, I12, I13 and I14 via the buffer 38a from the control terminal 36c is at a low level (second level), the high-frequency electronic switch 36 is made to be in an off (non-operational) state to stop supplying operational current with respect to each of the transistors Tr11, Tr12, Tr13, and Tr14 of the plurality of amplifying circuits 37A, 37B and 37C configured to be a differential type, which switches off those.

As a result, the plurality of amplifying circuits 37A, 37B and 37C are made to be in a non-amplification-operational state, which turns off between the positive-phase signal input terminal 36a and the negative-phase input terminal 36a', and between the positive-phase signal output terminal 36b and the negative-phase output terminal 36b' substantially high-frequency likewise.

As described above, when the high-frequency electronic switch 36 is in OFF (non-operating) state in the high-frequency electronic switch 36 shown in FIGS. 3A and 3B, the positive-phase and negative-phase carrier signals C and C' are prevented from passing through by turning off between the positive-phase signal input terminal 36a and the negative-phase input terminal 36a', and the positive-phase signal output terminal 36b and the negative-phase output terminal 36b' are opened substantially high-frequency likewise, i.e., isolations are carried out.

Accordingly, in a period when the high-frequency electronic switch 36 is in a non-operational (OFF-operating) state, leakage of the positive-phase and negative-phase carrier signals C and C' can be effectively suppressed.

In this case, the high-frequency electronic switch 36 is configured such that the plurality of amplifying circuits 37A, 37B and 37C with the transistors Tr which can control to supply operational current are cascade-connected between the positive-phase signal input terminal 36a and the negative-phase input terminal 36a', and the positive-phase signal output terminal 36b and the negative-phase output terminal 36b'. Consequently, isolations in a plurality of stages can be obtained, and leakage of high-frequency carrier signal in off state can be sufficiently suppressed even within a UWB frequency band or the like which is higher than the RR radiowave emission prohibited band described above.

In this way, the high-frequency electronic switch 36 shown in FIGS. 3A and 3B has the configuration in which the plurality of amplifying circuits with the transistors in which supply of operational current is controlled to be on/off based on a pulse signal Pa, and which are respectively configured to be a differential type are cascade-connected. Therefore, leakage of carrier signal in off state can be sufficiently suppressed to the extent of a number of the stages of the plurality of amplifying circuits.

As shown by the broken line in the drawing, the high-frequency electronic switch 36 shown in FIGS. 3A and 3B is also configured, for the same purpose as that of the high-frequency electronic switch 36 shown in FIG. 2B, to have a plurality of delay circuits D1, D2, and D3 which provide delays corresponding to delays in the positive-phase and negative-phase carrier signals C and C' sequentially amplified at the plurality of amplifying circuits 37A, 37B and 37C with respect to a pulse signal Pa input to the control terminal 36c. Consequently, the plurality of constant current circuits I1, I2 and I3 can be made to be in an operational state or a non-operational state in a timewise staggered manner so as to correspond to the delays in the carrier signals C and C' in accordance with a level of the pulse signal Pa input to the control terminal 36c.

Namely, the high-frequency electronic switch 36 shown in FIGS. 3A and 3B basically has the positive-phase signal input terminal 36a and the negative-phase signal input terminal 36a' to which positive-phase and negative-phase high-frequency signals C and C' to be switched are input, the plurality of amplifying circuits 37A, 37B and 37C having a differential configuration with the transistors Tr, which are cascade-connected in a plurality of stages to the positive-phase signal input terminal 36a and the negative-phase signal input terminal 36a', and which are for respectively amplifying the positive-phase and negative-phase high-frequency signals C and C' to be switched sequentially, the positive-phase signal output terminal 36b and the negative-phase signal output terminal 36b' which are connected to a differential output section of the amplifying circuit 37C at the final stage among the plurality of amplifying circuits 37A, 37B and 37C having the differential configuration, and which output the positive-phase and negative-phase high-frequency signals C and C' to be switched which are sequentially amplified, the control terminal 36c to which a pulse signal serving as a switching signal and having a period of a first level and a period of a second level is input, and the supply current control circuit 38 which makes the plurality of amplifying circuits 37A, 37B and 37C having the differential configuration be in an amplification-operational state by supplying operational current to each of the transistors Tr of the plurality of amplifying circuits 37A, 37B and 37C having the differential configuration when the pulse signal input to the control terminal 36c is within a period at the first level, and which makes the plurality of amplifying circuits 37A, 37B and 37C having the differential configuration be in a non-amplification-operational state by stopping supplying operational current to each of the transistors Tr of the plurality of amplifying circuits 37A, 37B and 37C having the differential configuration in a period when the pulse signal is at the second level. The high-frequency electronic switch 36 turns on/off between the positive-phase signal input terminal 36a and the negative-phase signal input terminal 36a', and between the positive-phase signal output terminal 36b and the negative-phase signal output terminal 36b' substantially high-frequency likewise in accordance with a level of the pulse signal input to the control terminal 36c.

Accordingly, the high-frequency electronic switch 36 shown in FIGS. 3A and 3B is preferably configured such that there are provided the positive-phase signal input terminal 36a and the negative-phase signal input terminal 36a' which are provided as the signal input terminal 36a, and to which at least one of positive-phase and negative-phase high-frequency signals C and C' is input as the high-frequency carrier signal, and the positive-phase signal output terminal 36b and the negative-phase signal output terminal 36b' which are provided as the signal output terminal 36e, and from which at least one of the positive-phase and negative-phase high-frequency signals C and C' is output. In addition, the plurality of amplifying circuits 37A, 37B and 37C which are cascade-connected in a plurality of stages between the positive-phase signal input terminal 36a and the negative-phase signal input terminal 36a', and between the positive-phase signal output terminal 36b and the negative-phase signal output terminal 36b' are respectively configured to be a differential type from the plurality of transistors Tr1, Tr2, Tr3 and Tr4.

Further, the high-frequency electronic switch 36 shown in FIG. 3B is preferably configured such that the plurality of constant current circuits I1, I2 and I3 are respectively constituted of the plurality of constant current circuits I11, I12, I13 and I14 with the transistors Tr11, Tr12, Tr13, Tr14, and Tr21, Tr22, Tr23, Tr24, and the pulse signal Pa input to the control terminal 36c is supplied to each of bases of the transistors Tr11, Tr12, Tr13, Tr14, and Tr21, Tr22, Tr23, Tr24 of the plurality of constant current circuits I11, I12, I33 and I14.

Further, the high-frequency electronic switch 36 shown in FIGS. 3A and 3B preferably further includes the synthetic circuit 37D connected between the positive-phase signal output terminal 36b and the negative-phase signal output terminal 36b'. The synthetic circuit 37D synthesizes the positive-phase and negative-phase high-frequency signals C and C', serving as the high-frequency carrier signal C, which are sequentially amplified at the plurality of amplifying circuits 37A, 37B and 37C configured to be a differential type, and are output from the positive-phase signal output terminal 36b and the negative-phase signal output terminal 36b', to be output when positive-phase and negative-phase high-frequency signals C and C' are respectively input as the high-frequency carrier signal C to the positive-phase signal input terminal 36a and the negative-phase signal input terminal 36a'.

Further, in the high-frequency electronic switch 36 shown in FIGS. 3A and 3B, more preferably, the supply current control circuit 38 includes the plurality of constant current circuits I11, I12, I13 and I14 connected to each of the transistors Tr1, Tr2, Tr3 and Tr4 of the plurality of amplifying circuits 37A, 37B and 37C configured to be a differential type. The plurality of constant current circuits I11, I12, I13 and I14 are made to be in an operational state or a non-operational state simultaneously or virtually simultaneously in accordance with a level of the pulse signal Pa input to the control terminal 36c, whereby the plurality of amplifying circuits 37A, 37B and 37C configured to be a differential type are made to be in an amplification-operational state or a non-amplification-operational state simultaneously or virtually simultaneously.

Further, in the high-frequency electronic switch 36 shown in FIGS. 3A and 3B, more preferably, the supply current control circuit 38' includes the plurality of constant current circuits I11, I12, I13 and I14 connected to each of the transistors Tr1, Tr2, Tr3 and Tr4 of the plurality of amplifying circuits 37A, 37B and 37C configured to be a differential type, and the plurality of delay circuits D1, D2, and D3 which provide delays corresponding to delays in the positive-phase and negative-phase high-frequency carrier signals C and C' which are sequentially amplified at the plurality of amplifying circuits 37A, 37B and 37C configured to be a differential type with respect to the pulse signal Pa input to the control terminal 36c. The plurality of constant current circuits I11, I12, I13 and I14 are made to be in an operational state or a non-operational state in a timewise staggered manner so as to correspond to the delays in the negative-phase high-frequency carrier signals C and C' in accordance with a level of the pulse signal Pa input to the control terminal 36c.

Figure 4:
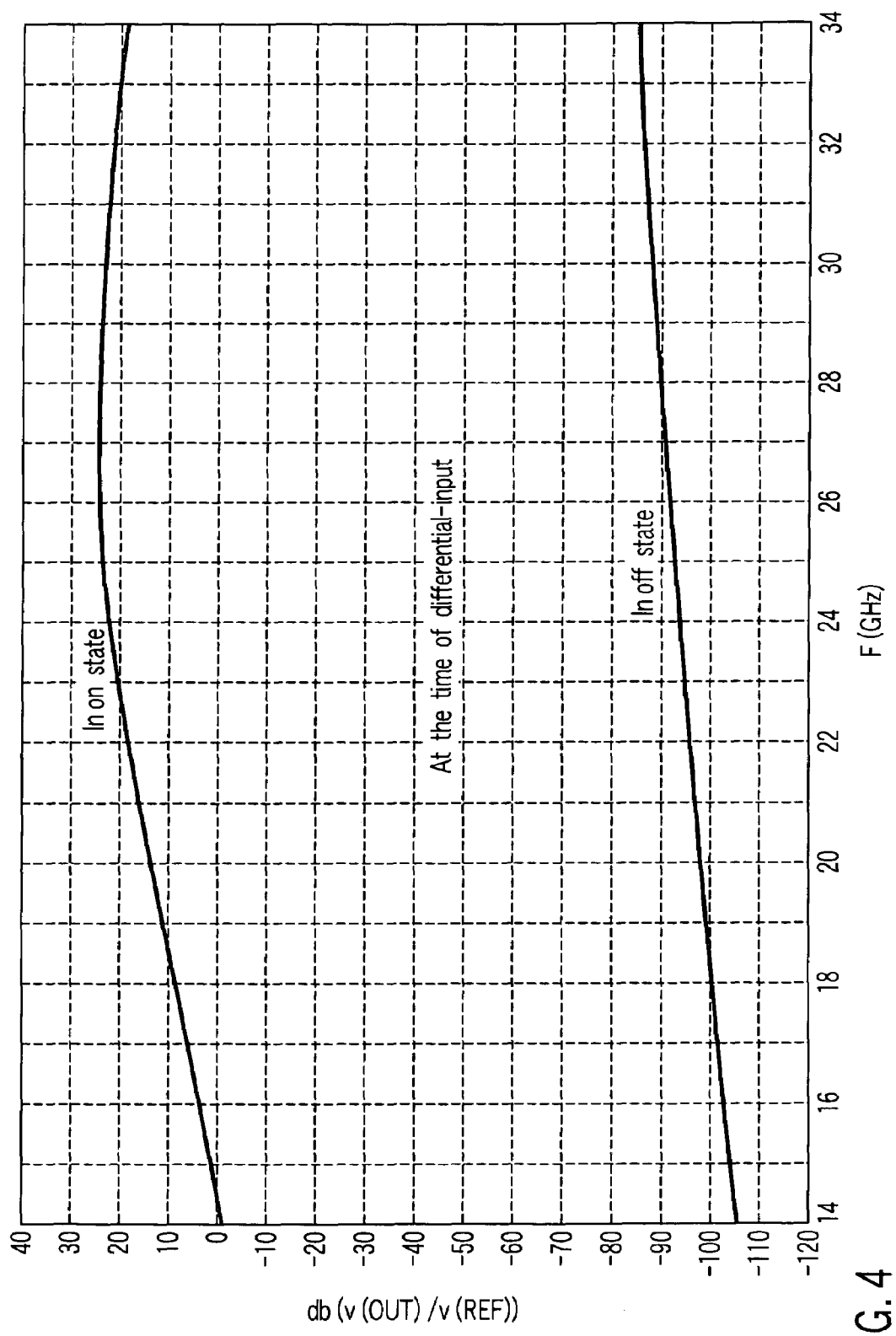
FIG. 4 is a graph showing simulation results of ON/OFF characteristics of the high-frequency electronic switch at the time of differential-input in the embodiment of FIGS. 3A and 3B.
Figure 5:
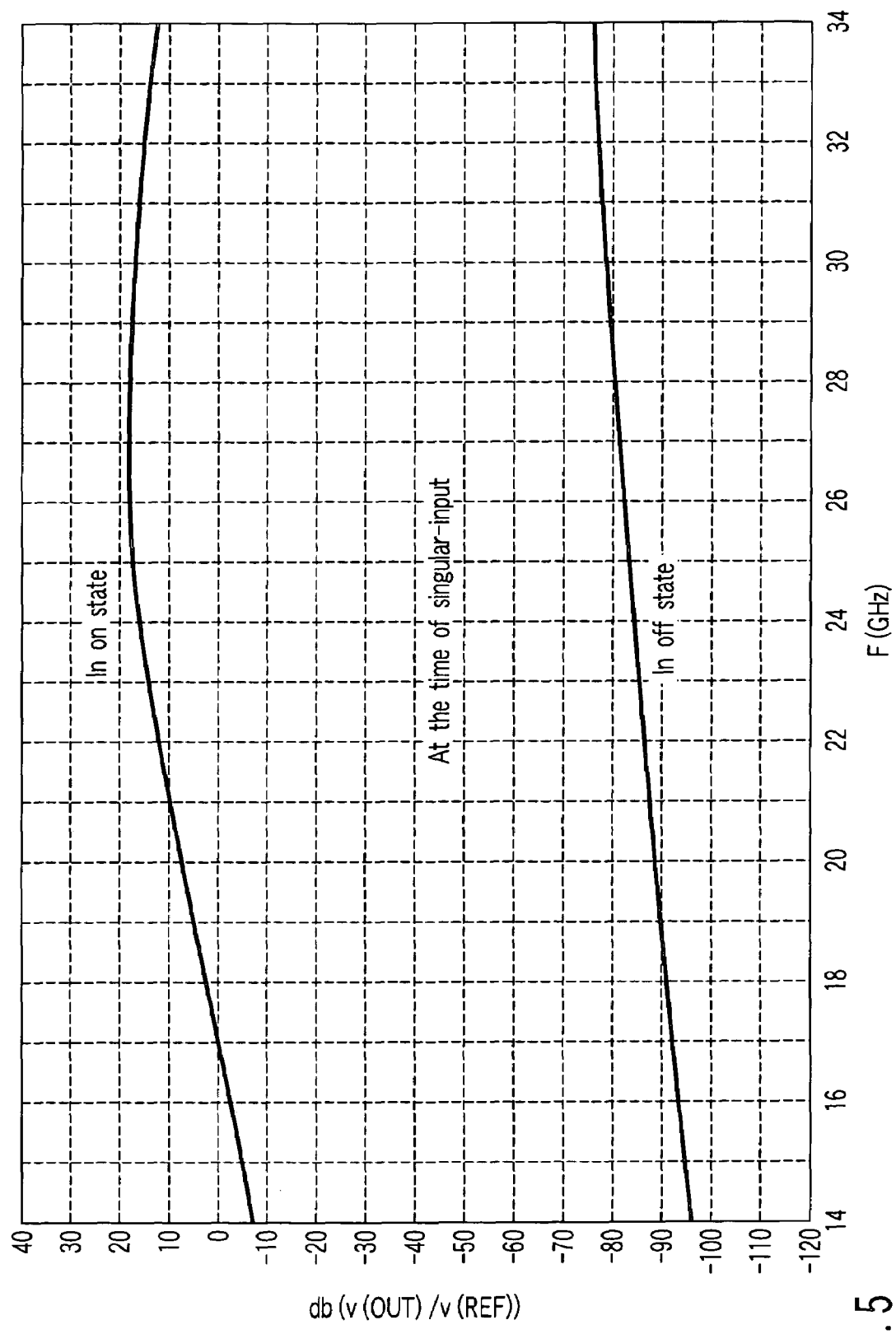
FIG. 5 is a graph showing simulation results of ON/OFF characteristics of the high-frequency electronic switch at the time of single input in the embodiment of FIGS. 3A and 3B.
Figure 6:
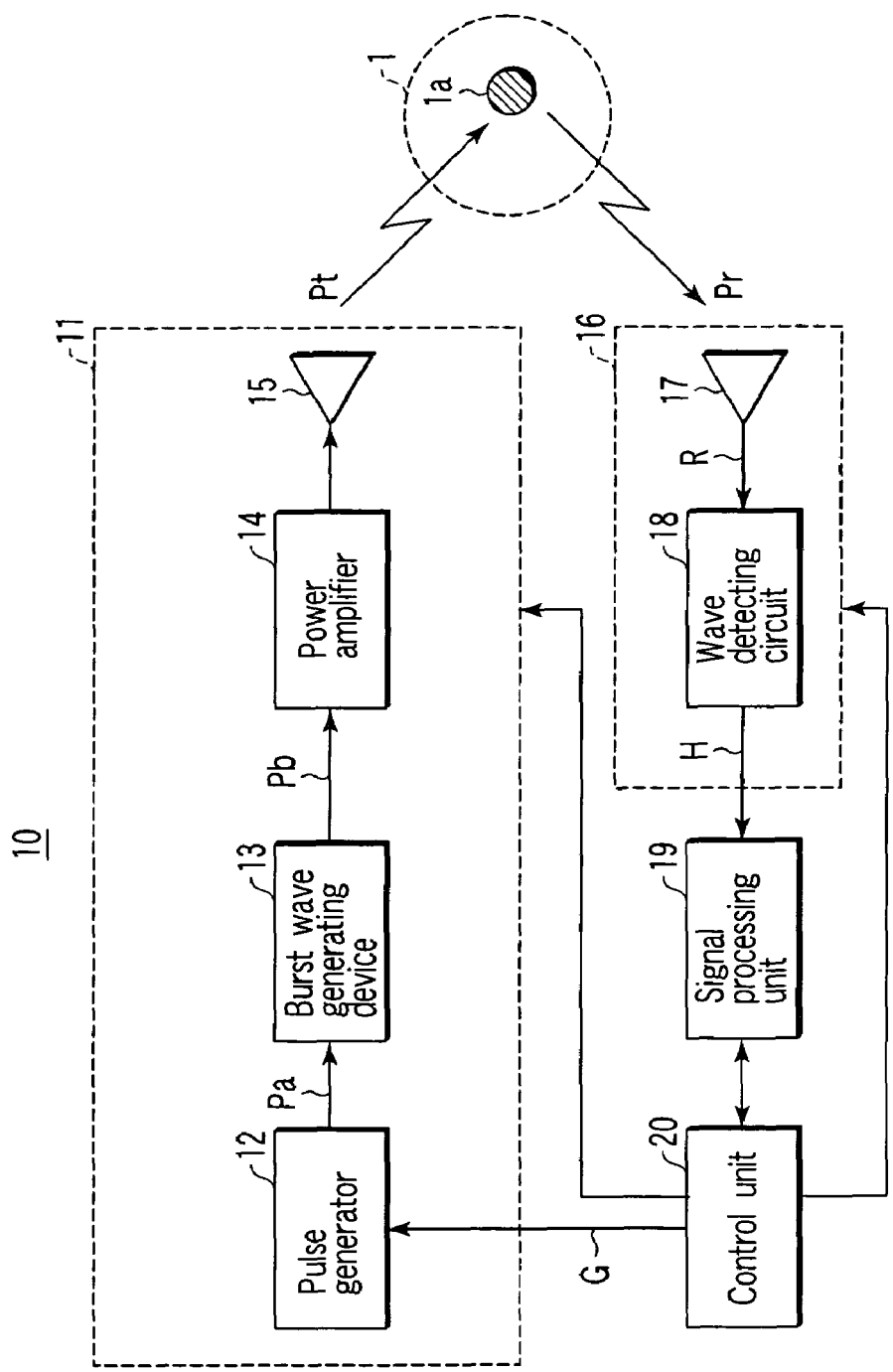
FIG. 6 is a block diagram showing a basic configuration of a conventional pulse radar.
Figure 7:
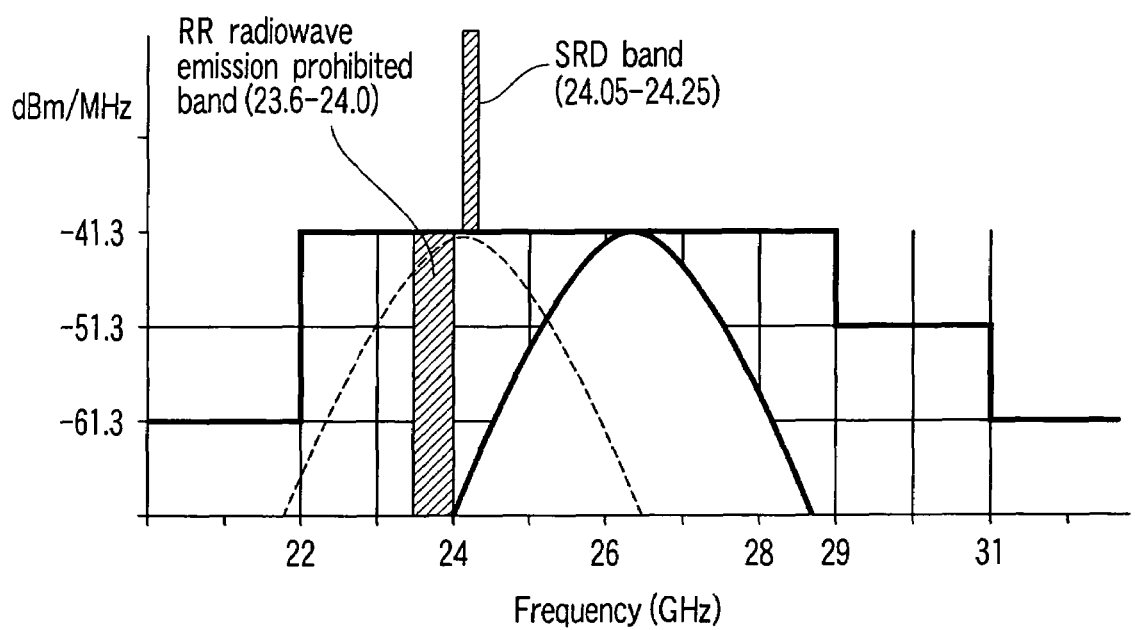
FIG. 7 is a graph showing a spectrum mask of a quasi-millimeter waveband UWB and a desired usable frequency band.

FIGS. 4 and 5 are simulation results of frequency characteristics of gains in on/off states of the high-frequency electronic switch 36 configured as shown in FIGS. 3A and 3B described above.

The characteristics of FIG. 4 are characteristics when carrier signals C and C' whose phases are respectively inverted are differentially input to the signal input terminals 36a and 36a' of the high-frequency electronic switch 36 configured as shown in FIGS. 3A and 3B, and an on/off ratio which is 110 dB or more is obtained at 26 GHz.

Further, the characteristics of FIG. 5 are characteristics when one carrier signal C is singularly input, and an on/off ratio of about 110 dB is obtained at 26 GHz.

It is considered that such a great on/off ratio is brought about due to a cancellation effect on leakage component in off state because the respective amplifying circuits 37A, 37B and 37C are configured to be a differential type.

However, the above-described characteristics are theoretical, and an on/off ratio when the circuits are mounted practically becomes worse than the above-described results. However, even if the worsened value is estimated to be 30 dB empirically, an on/off ratio of 80 dB or more can be expected, and leakage of carrier in the 26 GHz band can be sufficiently suppressed.

Further, because there is no need to use a coil in the circuit configuration of the high-frequency electronic switch 36, not as in a conventional high-frequency electronic switch, there is provided high-speed performance which can response to a pulse Pa with a narrow width, for example, whose width is 1 ns or less, which is used for a UWB radar system.

Then, as shown in FIG. 1, a burst wave Pb output from the high-frequency electronic switch 36 is amplified by the power amplifier 39, and is supplied to the transmitting antenna 32.

Therefore, a short pulse wave Pt described above is emitted from the transmitting antenna 32 into the space 1 which is an object to be searched for.

On the other hand, the receiving unit 40 receives a reflected wave Pr from the object 1a in the space 1 via the receiving antenna 41, and a received signal R thereof is amplified by a low noise amplifier (LNA) 42, and an output signal R' thereof is detected by a wave detecting circuit 43.

An output signal H from the wave detecting circuit 43 is converted into a digital value by an analog/digital (A/D) converter 45, and is input to the signal processing unit 50.

The signal processing unit 50 performs analysis on the object 1a existing in the space 1 based on the signal H obtained at the receiving unit 40, and informs of the analysis result through a output device (not shown, for example, a display or an audio generator), and gives notice of information required for control to the control unit 60.

The control unit 60 performs predetermined various controls necessary for search onto the transmitting unit 31 and the receiving unit 40 according to a schedule determined in advance with respect to the short range radar 30, or in accordance with a processing result at the signal processing unit 50.

In this way, the burst generating wave device 34 of the transmitting unit 31 is configured so as to generate a burst wave Pb by intermitting a carrier signal C by the high-frequency electronic switch 36 with extremely less leakage of carrier.

Accordingly, it suffices for a limit of a power density stipulated at the time of using UWB to take only an instant power of a short pulse wave output when a burst wave Pb serving as a transmitter pulse in a radar system is oscillating into consideration, which makes it possible to use the stipulated electric power as efficiently as possible.

Namely, as described above, the burst wave generating device shown in FIGS. 1, 2A, 2B, 3A and 3B includes the carrier signal generator 35 which continuously outputs a high-frequency carrier signal C, and the high-frequency electronic switch 36 which outputs the high-frequency carrier signal C output from the carrier signal generator 35 in a burst form, or makes it be in an output-stopped state. The high-frequency electronic switch 36 has the signal input terminal 36a which receives the high-frequency carrier signal C, the plurality of amplifying circuits 37A, 37B and 37C with the transistors Tr which are cascade-connected in a plurality of stages to the signal input terminal 36a, and which are for respectively amplifying the high-frequency carrier signal C sequentially, the signal output terminal 36e which is connected to an output section of the amplifying circuit 37C at the final stage among the plurality of amplifying circuits 37A, 37B and 37C, and which outputs the high-frequency carrier signal C which is sequentially amplified, the control terminal 36c to which a pulse signal Pa serving as a switching signal and having a period of a first level and a period of a second level is input, and the supply current control circuit 38 which makes the plurality of amplifying circuits 37A, 37B and 37C be in an amplification-operational state by supplying operational current to each of the transistors Tr of the plurality of amplifying circuits 37A, 37B and 37C when a pulse signal Pb input to the control terminal 36c is within a period at the first level, and which makes the plurality of amplifying circuits 37A, 37B and 37C be in a non-amplification-operational state by stopping supplying operational current to each of the transistors Tr of the plurality of amplifying circuits 37A, 37B and 37C when the pulse signal Pa is within a period at the second level. The high-frequency carrier signal C is output in a burst form, or is made to be in an output-stopped state by turning on/off between the signal input terminal 36a and the signal output terminal 36e substantially high-frequency likewise in accordance with a level of the pulse signal Pa input to the control terminal 36c by the high-frequency electronic switch 36.

Further, as described above, the short range radar shown in FIGS. 1, 2A, 2B, 3A and 3B includes the transmitting unit 31 having the burst wave generating device 34 which includes the carrier signal generator 35 which continuously outputs a high-frequency carrier signal C in order to emit a short pulse wave Pt with a predetermined width into the space 1 every time a transmission trigger signal G is received, and the high-frequency electronic switch 36 which outputs the high-frequency carrier signal C output from the carrier signal generator 35 in a burst form, or makes it be in an output-stopped state, the receiving unit 40 which performs receiving and wave detecting processing onto a reflected wave Pr of the short pulse wave Pt, the signal processing unit 50 which performs analysis processing onto the object 1a existing in the space 1 based on an output from the receiving unit 40, and the control unit 60 which performs predetermined control onto at least one of the transmitting unit 31 and the receiving unit 40 based on an analysis result from the signal processing unit 50. The high-frequency electronic switch 36 of the burst wave generating device 34 includes the signal input terminal 36a which receives the high-frequency carrier signal C, the plurality of amplifying circuits 37A, 37B and 37C with the transistors Tr which are cascade-connected in a plurality of stages to the signal input terminal 36a, and which are for respectively amplifying the high-frequency carrier signal C sequentially, the signal output terminal 36e which is connected to an output section of the amplifying circuit 37C at the final stage among the plurality of amplifying circuits 37A, 37B and 37C, and which outputs the high-frequency carrier signal C sequentially amplified, the control terminal 36c to which a pulse signal Pa serving as a switching signal and having a period at a first level and a period at a second level is input, and the supply current control circuit 38 which makes the plurality of amplifying circuits 37A, 37B and 37C be in an amplification-operational state by supplying operational current to each of the transistors Tr of the plurality of amplifying circuits 37A, 37B and 37C when a pulse signal input to the control terminal 36c is within a period at the first level, and which makes the plurality of amplifying circuits 37A, 37B and 37C be in a non-amplification-operational state by stopping supplying operational current to each of the transistors Tr of the plurality of amplifying circuits 37A, 37B and 37C when the pulse signal Pa is within a period at the second level. The high-frequency carrier signal C is output in a burst form, or is made to be in an output-stopped state by turning on/off the between the signal input terminal 36a and the signal output terminal 36e substantially high-frequency likewise in accordance with a level of the pulse signal Pa input to the control terminal 36c by the high-frequency electronic switch 36.

Further, as described above, the burst wave generating device and the short range radar shown in FIGS. 1, 2A, 2B, 3A and 3B preferably includes the positive-phase signal input terminal 36a and the negative-phase signal input terminal 36a' which are provided as the signal input terminal 36a of the high-frequency electronic switch 36, and to which at least one of positive-phase and negative-phase high-frequency carrier signals C and C' is input as the high-frequency carrier signal C, and the positive-phase signal output terminal 36b and the negative-phase signal output terminal 36b' which are provided as the signal output terminal 36e of the high-frequency electronic switch 36, and from which at least one of the positive-phase and negative-phase high-frequency carrier signals C and C' is output. The plurality of amplifying circuits 37A, 37B and 37C which are cascade-connected in a plurality of stages between the positive-phase signal input terminal 36a and the negative-phase signal input terminal 36a', and between the positive-phase signal output terminal 36b and the negative-phase signal output terminal 36b' are respectively configured to be a differential type with the plurality of transistors Tr1, Tr2, Tr3 and Tr4.

As described above, in the burst wave generating device and the short range radar shown in FIGS. 1, 2A, 2B, 3A and 3B, more preferably, the supply current control circuit 38 of the high-frequency electronic switch 36 includes the plurality of constant current circuits I1, I2 and I3 which are connected to each of the transistors of the plurality of amplifying circuits 37A, 37B and 37C. The plurality of constant current circuits I1, I2 and I3 are made to be in an operational state or a non-operational state simultaneously or virtually simultaneously in accordance with a level of a pulse signal Pa input to the control terminal 36c, whereby the plurality of amplifying circuits 37A, 37B and 37C are made to be in an amplification-operational state or a non-amplification-operational state simultaneously or virtually simultaneously.

Furthermore, as described above, the burst wave generating device and the short range radar shown in FIGS. 1, 2A, 2B, 3A and 3B are preferably configured such that the plurality of constant current circuits I1, I2 and I3 are respectively constituted of the plurality of constant current circuits I1, I2, I3, I11, I12, I13 and I14 with transistors Q, Tr11, Tr12, Tr13, Tr14, and Tr21, Tr22, Tr23, Tr24, and the pulse signal Pa input to the control terminal 36c is supplied to each of the bases of the transistors Q, Tr11, Tr12, Tr13, Tr14, and Tr21, Tr22, Tr23, Tr24 of the plurality of constant current circuits I1, I2, I3, I11, I12, I13 and I14.

Moreover, as described above, in the burst wave generating device and the short range radar shown in FIGS. 1, 2A, 2B, 3A and 3B, more preferably, the supply current control circuit 38' includes the plurality of constant current circuits I1, I2, I3, I11, I12, I13 and I14 which are respectively connected to the transistors Tr, Tr1, Tr2, Tr3 and Tr4 of the plurality of amplifying circuits 37A, 37B and 37C, and the plurality of delay circuits D1 and D2 which provide delays corresponding to delays in positive-phase and negative-phase high-frequency carrier signals C and C' sequentially amplified in the plurality of amplifying circuits 37A, 37B and 37C with respect to the pulse signal Pa input to the control terminal 36c. The plurality of constant current circuits I1, I2, I3, I11, I12, I13 and I14 are made to be in an operational state or a non-operational state in a timewise staggered manner so as to correspond to the delays in the negative-phase high-frequency carrier signals C and C' in accordance with a level of the pulse signal Pa input to the control terminal 36c.

Further, as described above, the burst wave generating device and the short range radar shown in FIGS. 1, 2A, 2B, 3A and 3B are preferably configured such that the plurality of constant current circuits I1, I2 and I3 are respectively constituted of the plurality of constant current circuits I1, I2, I3, I11, I12, I13 and I14 with transistors Q, Tr11, Tr12, Tr13, Tr14, and Tr21, Tr22, Tr23, Tr24, and a pulse signal Pa input to the control terminal 36c is supplied to each of the bases of the transistors Q, Tr11, Tr12, Tr13, Tr14, and Tr21, Tr22, Tr23, Tr24 of the plurality of constant current circuits I1, I2, I3, I11, I12, I13 and I14.

In addition, as described above, the burst wave generating device and the short range radar shown in FIGS. 1, 2A, 2B, 3A and 3B preferably include the synthetic circuit 37D which is connected between the positive-phase signal output terminal 36b and the negative-phase signal output terminal 36b'. When positive-phase and negative-phase high-frequency carrier signals C and C' are respectively input as the high-frequency carrier signal C to be switched to the positive-phase signal input terminal 36a and the negative-phase signal input terminal 36a', the synthetic circuit 37D synthesizes the positive-phase and negative-phase high-frequency carrier signals C and C', serving as the high-frequency carrier signal C, which are sequentially amplified at the plurality of amplifying circuits 37A, 37B and 37C configured to be a differential type, and are output from the positive-phase signal output terminal 36b and the negative-phase signal output terminal 36b', to be output.

INDUSTRIAL APPLICABILITY

Note that the above-described embodiment is an example in which the present invention is used for an UWB short range radar. However, the high-frequency electronic switch and the burst wave generating device of the present invention can be applied to, not only UWB short range radars, but also devices which intermit a high-frequency signal and generate a burst wave within a frequency band other than that in UWB.

The invention claimed is:

1. A high-frequency electronic switch comprising:
   a signal input terminal to which a high-frequency signal to be switched is input;
   a plurality of amplifying circuits with transistors to respectively amplify the high-frequency signal to be switched sequentially, the amplifying circuits being cascade-connected in a plurality of stages to the signal input terminal;

a signal output terminal which is connected to an output section of an amplifying circuit at final stage among the plurality of amplifying circuits, and which outputs the high-frequency signal to be switched sequentially amplified;

a control terminal to which a pulse signal serving as a switching signal and having a period of a first level and a period of a second level is input; and a supply current control circuit which makes the plurality of amplifying circuits be in an amplification-operational state by supplying operational current to each of the transistors of the plurality of amplifying circuits in a period when the pulse signal input to the control terminal is at the first level, and which makes the plurality of amplifying circuits be in a non-amplification-operational state by stopping supplying operational current to each of the transistors of the plurality of amplifying circuits in a period when the pulse signal is at the second level, the high-frequency electronic switch which turns on/off between the signal input terminal and the signal output terminal substantially high-frequency likewise in accordance with a level of the pulse signal input to the control terminal.

2. The high-frequency electronic switch according to claim 1, characterized by comprising:

a positive-phase signal input terminal and a negative-phase signal input terminal which are provided as the signal input terminal, and to which at least one of positive-phase and negative-phase high-frequency signals is input as the high-frequency signal for being switched; and a positive-phase signal output terminal and a negative-phase signal output terminal which are provided as the signal output terminal, and from which at least one of the positive-phase and negative-phase high-frequency signals is output, wherein the plurality of amplifying circuits which are cascade-connected in a plurality of stages between the positive-phase signal input terminal and the negative-phase signal input terminal, and between the positive-phase signal output terminal and the negative-phase signal output terminal, are respectively configured to be a differential type with a plurality of transistors.

3. The high-frequency electronic switch according to claim 1 or 2, characterized in that the supply current control circuit includes a plurality of constant current circuits which are connected to each of the transistors of the plurality of amplifying circuits, and makes the plurality of amplifying circuits be in an amplification-operational state or a non-amplification-operational state simultaneously or virtually simultaneously by making the plurality of constant current circuits be in an operational state or a non-operational state simultaneously or virtually simultaneously in accordance with a level of the pulse signal input to the control terminal.

4. The high-frequency electronic switch according to claim 3, characterized in that the high-frequency electronic switch is configured such that the plurality of constant current circuits of the supply current control circuit are respectively composed of a plurality of constant current circuits with transistors, and that the pulse signal input to the control terminal is supplied to each of bases of the transistors of the plurality of constant current circuits.

5. The high-frequency electronic switch according to claim 1 or 2, characterized in that the supply current control circuit includes: the plurality of constant current circuits which are connected to each of the transistors of the plurality of amplifying circuits; and a plurality of delay circuits which provide a delay corresponding to a delay in the high-frequency signal to be switched sequentially amplified in the plurality of amplifying circuits with respect to the pulse signal input to the control terminal, and makes the plurality of constant current circuits be in an operational state or a non-operational state in a timewise staggered manner so as to correspond to the delay in the high-frequency signal in accordance with a level of the pulse signal input to the control terminal.

6. The high-frequency electronic switch according to claim 5, characterized in that the high-frequency electronic switch is configured such that the plurality of constant current circuits of the supply current control circuit are respectively constituted of a plurality of constant current circuits with transistors, and that the pulse signal input to the control terminal is supplied to each of bases of the transistors of the plurality of constant current circuits.

7. The high-frequency electronic switch according to claim 2, characterized by further comprising:

a synthetic circuit which is connected between the positive-phase signal output terminal and the negative-phase signal output terminal, and which synthesizes and outputs the positive-phase and negative-phase high-frequency signals, serving as the high-frequency signal for being switched, which are sequentially amplified at the plurality of amplifying circuits configured to be a differential type, and are output from the positive-phase signal output terminal and the negative-phase signal output terminal, when positive-phase and negative-phase high-frequency signals are respectively input as the high-frequency signal to be switched to the positive-phase signal input terminal and the negative-phase signal input terminal.

8. A burst wave generating device comprising:

a carrier signal generator which continuously outputs a high-frequency carrier signal; and a high-frequency electronic switch which outputs the high-frequency carrier signal output from the carrier signal generator in a burst form, or makes it be in an output-stopped state, wherein the high-frequency electronic switch comprises:

a signal input terminal which receives the high-frequency carrier signal;

a plurality of amplifying circuits with transistors, to respectively amplify the high-frequency carrier signal sequentially, the amplifying circuits being cascade-connected in a plurality of stages to the signal input terminal;

a signal output terminal which is connected to an output section of an amplifying circuit at final stage among the plurality of amplifying circuits, and which outputs the high-frequency carrier signal to be sequentially amplified;

a control terminal to which a pulse signal serving as a switching signal having a period of a first level and a period of a second level is input; and a supply current control circuit which makes the plurality of amplifying circuits be in an amplification-operational state by supplying operational current to each of the transistors of the plurality of amplifying circuits in a period when the pulse signal input to the control terminal is at the first level, and which makes the plurality of amplifying circuits be in a non-amplification-operational state by stopping supplying operational current to each of the transistors of the plurality of amplifying circuits in a period when the pulse signal is at the second level, and the high-frequency carrier signal is output in a burst form, or is made to be in an output-stopped state by turning on/off between the signal input terminal and the signal output terminal substantially high-frequency likewise in accordance with a level of the pulse signal input to the control terminal by the high-frequency electronic switch.

9. The burst wave generating device according to claim 8, characterized by comprising:

a positive-phase signal input terminal and a negative-phase signal input terminal which are provided as the signal input terminal of the high-frequency electronic switch, and to which at least one of positive-phase and negative-phase high-frequency carrier signals is input as the high-frequency carrier signal; and a positive-phase signal output terminal and a negative-phase signal output terminal which are provided as the signal output terminal of the high-frequency electronic switch, and from which at least one of the positive-phase and negative-phase high-frequency carrier signals is output, wherein the plurality of amplifying circuits which are cascade-connected in a plurality of stages between the positive-phase signal input terminal and the negative-phase signal input terminal, and between the positive-phase signal output terminal and the negative-phase signal output terminal, are respectively configured to be a differential type with a plurality of transistors.

10. The burst wave generating device according to claim 8 or 9, characterized in that the supply current control circuit of the high-frequency electronic switch includes a plurality of constant current circuits which are connected to each of the transistors of the plurality of amplifying circuits, and makes the plurality of amplifying circuits be in an amplification-operational state or a non-amplification-operational state simultaneously or virtually simultaneously by making the plurality of constant current circuits be in an operational state or a non-operational state simultaneously or virtually simultaneously in accordance with a level of the pulse signal input to the control terminal.

11. The burst wave generating device according to claim 10, characterized in that the high-frequency electronic switch is configured such that the plurality of constant current circuits of the supply current control circuit are respectively constituted of a plurality of constant current circuits with transistors, and that the pulse signal input to the control terminal is supplied to each of bases of the transistors of the plurality of constant current circuits.

12. The burst wave generating device according to claim 8 or 9, characterized in that the supply current control circuit of the high-frequency electronic switch includes: a plurality of constant current circuits which are connected to each of the transistors of the plurality of amplifying circuits; and a plurality of delay circuits which provide a delay corresponding to a delay in the high-frequency carrier signal to be sequentially amplified at the plurality of amplifying circuits with respect to the pulse signal input to the control terminal, and makes the plurality of constant current circuits be in an operational state or a non-operational state in a timewise staggered manner so as to correspond to the delay in the high-frequency carrier signal in accordance with a level of the pulse signal input to the control terminal.

13. The burst wave generating device according to claim 12, characterized in that the high-frequency electronic switch is configured such that the plurality of constant current circuits of the supply current control circuit are respectively constituted of a plurality of constant current circuits with transistors, and that the pulse signal input to the control terminal is supplied to each of bases of the transistors of the plurality of constant current circuits.

14. The burst wave generating device according to claim 9, characterized in that the high-frequency electronic switch further comprises a synthetic circuit which is connected between the positive-phase signal output terminal and the negative-phase signal output terminal, and which synthesizes and outputs the positive-phase and negative-phase high-frequency carrier signals serving as the high-frequency carrier signal, which are sequentially amplified at the plurality of amplifying circuits configured to be a differential type, and which are output from the positive-phase signal output terminal and the negative-phase signal output terminal when positive-phase and negative-phase high-frequency carrier signals are respectively input as the high-frequency carrier signal to the positive-phase signal input terminal and the negative-phase signal input terminal.

\* \* \* \* \*

UNITED STATES PATENT AND TRADEMARK OFFICE
CERTIFICATE OF CORRECTION

PATENT NO.       : 7,522,004 B2
APPLICATION NO.  : 10/588910
DATED            : April 21, 2009
INVENTOR(S)      : Sumio Saito It is certified that error appears in the above-identified patent and that said Letters Patent is hereby corrected as shown below:

On the title page:

Under Item (73) Assignee;

after "Anritsu Corporation, Tokyo (JP)"

insert -- and Panasonic Corporation, Osaka (JP) --

Signed and Sealed this
First Day of February, 2011

David J. Kappos
*Director of the United States Patent and Trademark Office*